(12) United States Patent
Jeong et al.

(10) Patent No.: US 12,369,480 B2
(45) Date of Patent: Jul. 22, 2025

(54) TOUCH SCREEN INTEGRATED LIGHT-EMITTING DISPLAY DEVICE

(71) Applicant: LG Display Co., Ltd., Seoul (KR)

(72) Inventors: SangHoon Jeong, Paju-si (KR); TaeYeon Yoo, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/399,116

(22) Filed: Dec. 28, 2023

(65) Prior Publication Data

US 2024/0260380 A1    Aug. 1, 2024

(30) Foreign Application Priority Data

Jan. 27, 2023    (KR) .................. 10-2023-0010741

(51) Int. Cl.
*H10K 59/40* (2023.01)
*G06F 3/044* (2006.01)
*H10K 59/80* (2023.01)

(52) U.S. Cl.
CPC ........... *H10K 59/40* (2023.02); *G06F 3/0446* (2019.05); *H10K 59/873* (2023.02)

(58) Field of Classification Search
CPC ..... H10K 59/40; H10K 59/873; G06F 3/0446
See application file for complete search history.

(56) References Cited

U.S. PATENT DOCUMENTS

| | | | |
|---|---|---|---|
| 2017/0262109 A1* | 9/2017 | Choi | G06F 3/04164 |
| 2020/0083314 A1* | 3/2020 | Choi | H10K 59/122 |
| 2021/0020715 A1* | 1/2021 | Ochi | G09F 9/00 |
| 2021/0405797 A1* | 12/2021 | Bae | G06F 3/0412 |

FOREIGN PATENT DOCUMENTS

KR    20220077013 A    6/2022

* cited by examiner

*Primary Examiner* — Peter D McLoone
(74) *Attorney, Agent, or Firm* — Seed IP Law Group LLP

(57) ABSTRACT

A light-emitting display device according to an embodiment of the present specification may include a substrate including a display area and a non-display area, one or more dams disposed in the non-display area and configured to surround the display area, and a reflective metal disposed on at least one of the one or more dams.

17 Claims, 12 Drawing Sheets

TOUCH SCREEN INTEGRATED LIGHT-EMITTING DISPLAY DEVICE

CROSS-REFERENCE TO RELATED APPLICATIONS

This application claims the priority of Korean Patent Application No. 10-2023-0010741 filed on Jan. 27, 2023, in the Korean Intellectual Property Office, the disclosure of which is incorporated herein by reference.

BACKGROUND

Technical Field

The present specification relates to a touch screen integrated light-emitting display device, and more particularly, to a display device in which a touch electrode is disposed on an encapsulation part.

Description of the Related Art

With the development of an information-oriented society, there is an increasing demand for display devices for displaying images. Various types of display devices such as a liquid crystal display device and an organic light-emitting display device are used as the display devices.

In order to provide more diverse features to a user, the display device may recognize the user's touch on a display panel and perform the input processing based on the recognized touch. For example, a plurality of touch electrodes may be disposed in an active area of the display panel. Further, the display device may sense a touch by detecting a change in capacitance of the touch electrode made by the user's touch. In particular, in case that the touch electrode is applied to an organic light-emitting display device, elements, which constitute a touch element, may be formed on an upper or lower portion of an encapsulation layer for protecting a light-emitting element of the organic light-emitting display device. That is, to sense the user's touch on the display panel, the plurality of touch electrodes is disposed on the display panel, and connection lines are disposed to connect the touch electrodes to a drive circuit.

Meanwhile, an outer periphery of the display device is cured by using high-energy ultraviolet (UV) rays to implement a thin bezel.

BRIEF SUMMARY

The inventors have realized that the high-energy UV rays react with organic films positioned on the light-emitting element in the active area and cause outgassing, and gaseous components may affect a lifespan of the light-emitting element. Therefore, it is beneficial to reduce an adverse effect caused by high-energy UV rays by changing an arrangement design of various constituent elements including a touch sensor metal disposed on the encapsulation layer.

A benefit to be achieved by the present disclosure is to provide a touch screen integrated light-emitting display device capable of suppressing degradation of a light-emitting element caused by high-energy UV rays (having the light amount of about 67,500 mJ/cm$^2$) emitted from a lateral side.

Benefits of the present disclosure are not limited to the above-mentioned benefit, and other benefits, which are not mentioned above, can be clearly understood by those skilled in the art from the following descriptions.

According to an aspect of the present disclosure, a touch screen integrated light-emitting display device includes a substrate including a display area and a non-display area, one or more dams disposed in the non-display area and configured to surround the display area, and a reflective metal disposed on at least one of the one or more dams.

Other detailed matters of the exemplary embodiments are included in the detailed description and the drawings.

The touch screen integrated light-emitting display device according to the embodiment of the present specification has the reflective metal configured to reflect high-energy UV rays (having the light amount of about 67,500 mJ/cm$^2$) to the outside, thereby suppressing the degradation of the light-emitting element caused by the high-energy UV rays.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
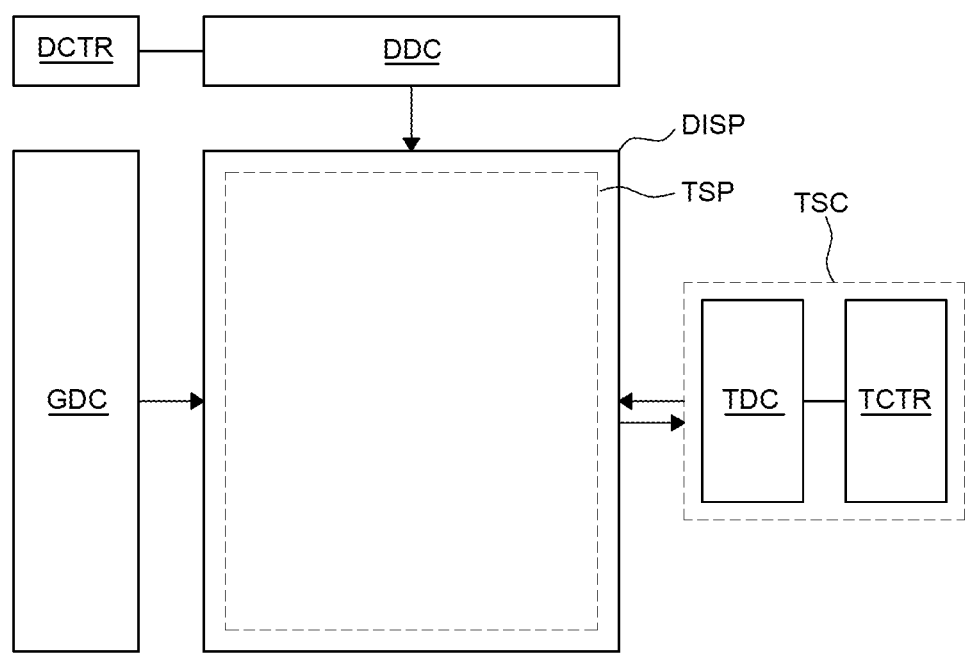
FIG. 1 is a view illustrating a schematic configuration of a touch screen integrated light-emitting display device according to embodiments of the present specification.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto.

Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first." "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to the accompanying drawings.

Transistors used for a display device according to embodiments of the present specification may be implemented as any one transistor among n-channel transistors (NMOS) and p-channel transistors (PMOS). The transistor may be implemented as an oxide semiconductor transistor having an active layer made of an oxide semiconductor or a low-temperature polysilicon (LTPS) transistor having an active layer made of low-temperature polysilicon (LTPS). The transistor may at least include a gate electrode, a source electrode, and a drain electrode. The transistor may be implemented as a thin-film transistor (TFT) on a display panel. In the transistor, carriers flow from the source electrode to the drain electrode. Because the carrier is the electron in the n-channel transistor (NMOS), a source voltage may be lower than a drain voltage so that the electrons flow from the source electrode to the drain electrode. In the n-channel transistor (NMOS), the current may flow from the drain electrode to the source electrode, and the source electrode may be an output terminal. Because the carrier is the positive hole in the p-channel transistor (PMOS), a source voltage may be higher than a drain voltage so that the positive holes flow from the source electrode to the drain electrode. Because the positive holes flow from the source electrode to the drain electrode in the p-channel transistor (PMOS), the current may flow from the source to the drain, and the drain electrode may be an output terminal. Therefore, it should be noted that the source and the drain of the transistor are not fixed because the source and the drain may be changed in accordance with an applied voltage. The present specification is described on the assumption that the transistor is the n-channel transistor (NMOS). However, the present disclosure is not limited thereto. The p-channel transistor may be used as the transistor. Therefore, the circuit configuration may be changed.

A gate signal of the transistors used as switch elements may swing between a gate-on voltage and a gate-off voltage. The gate-on voltage may be set to a voltage higher than a threshold voltage Vth of the transistor. The gate-off voltage may be set to a voltage lower than the threshold voltage Vth of the transistor. The transistor may be turned on in response to the gate-on voltage. The transistor may be turned off in response to the gate-off voltage. In the case of the n-channel transistor (NMOS), the gate-on voltage may be a gate high voltage (VGH), and the gate-off voltage may be a gate low voltage (VGL). In the case of the p-channel transistor (PMOS), the gate-on voltage may be a gate low voltage (VGL), and the gate-off voltage may be a gate high voltage (VGH).

Hereinafter, various embodiments of the present specification will be described in detail with reference to the accompanying drawings.

FIG. 1 is a system configuration view of a touch screen integrated light-emitting display device according to embodiments of the present specification.

With reference to FIG. 1, the touch screen integrated light-emitting display device according to the embodiments of the present specification may provide both a function of displaying images and a function of sensing touches.

To provide the image display function, the touch screen integrated light-emitting display device according to the embodiments of the present specification may include a display panel DISP on which a plurality of data lines and a plurality of gate lines are disposed and a plurality of sub-pixels positioned at regions of overlap of the plurality of data lines and the plurality of gate lines are arranged, a data drive circuit DDC configured to operate the plurality of data lines, a gate drive circuit GDC configured to operate the plurality of gate lines, and a display controller DCTR configured to control an operation of the data drive circuit DDC and an operation of the gate drive circuit GDC.

The data drive circuit DDC, the gate drive circuit GDC, and the display controller DCTR may be implemented as one or more separate components. In some instances, two or more components, among the data drive circuit DDC, the gate drive circuit GDC, and the display controller DCTR, may be integrated into a single component. For example, the data drive circuit DDC and the display controller DCTR may be implemented as a single integrated circuit chip (IC chip).

To provide the touch sensing function, the touch screen integrated light-emitting display device according to the embodiments of the present specification may include a touch panel TSP including a plurality of touch electrodes, and a touch sensing circuit TSC configured to supply a touch driving signal to the touch panel TSP, detect a touch sensing signal from the touch panel TSP, and sense a touch position (touch coordinate) or whether a user's touch is made on the touch panel TSP on the basis of the detected touch sensing signal.

For example, the touch sensing circuit TSC may include a touch drive circuit TDC configured to supply the touch driving signal to the touch panel TSP and detect the touch sensing signal from the touch panel TSP, and a touch controller TCTR configured to sense a touch position and/or whether the user's touch is made on the touch panel TSP on the basis of the touch sensing signal detected by the touch drive circuit TDC.

The touch drive circuit TDC may include a first circuit part configured to supply the touch driving signal to the touch panel TSP, and a second circuit part configured to detect the touch sensing signal from the touch panel TSP.

The touch drive circuit TDC and the touch controller TCTR may be implemented as separate components or integrated into a single component in some instances.

Meanwhile, the data drive circuit DDC, the gate drive circuit GDC, and the touch drive circuit TDC may each be implemented as one or more integrated circuits. The data drive circuit DDC, the gate drive circuit GDC, and the touch drive circuit TDC may be implemented as a chip-on-glass (COG) type, a chip-on-film (COF) type, or a tape carrier package (TCP) type in a standpoint related to the electrical connection with the display panel DISP. The gate drive circuit GDC may also be implemented as a gate-in-panel (GIP) type.

Meanwhile, the circuit components DDC, GDC, and DCTR for the display operation and the circuit components TDC and TCTR for the touch sensing may be implemented as one or more separate components. In some instances, one or more components, among the circuit components DDC, GDC, and DCTR for the display operation, and one or more components, among the circuit components TDC and TCTR for the touch sensing, may be integrated functionally and implemented as one or more components.

For example, the data drive circuit DDC and the touch drive circuit TDC may be integrated into one or more integrated circuit chips. In the case in which the data drive circuit DDC and the touch drive circuit TDC are integrated into the two or more integrated circuit chips, the two or more integrated circuit chips may each have a data operating function and a touch operating function.

Meanwhile, the touch screen integrated light-emitting display device according to the embodiments of the present specification may be various types of display devices such as an organic light-emitting display device or a liquid crystal display device. Hereinafter, for convenience of description, an example will be described in which the touch screen integrated light-emitting display device is an organic light-emitting display device. That is, various types of display panels DISP such as an organic light-emitting display panel or a liquid crystal display panel may be used. Hereinafter, for convenience of description, an example will be described in which the display panel DISP is an organic light-emitting display panel.

Meanwhile, as described below, the touch panel TSP may include a plurality of touch electrodes to which the touch driving signal TDS may be applied or from which the touch sensing signal may be detected, and a plurality of touch routing lines configured to connect the plurality of touch electrodes to the touch drive circuit TDC.

The touch panel TSP may be present outside the display panel DISP. That is, the touch panel TSP and the display panel DISP may be separately manufactured and then coupled. The touch panel TSP may be referred to as an externally-carried type or an add-on type.

Alternatively, the touch panel TSP may also be embedded in the display panel DISP. That is, at the time of manufacturing the display panel DISP, the touch sensor structure including the plurality of touch electrodes and the plurality of touch routing lines, which constitute the touch panel TSP, may be formed together with the signal lines and electrodes for the display operation. The touch panel TSP may be referred to as an embedded type. For the convenience of description, an example will be described below in which the touch panel TSP is the embedded type.

Figure 2:
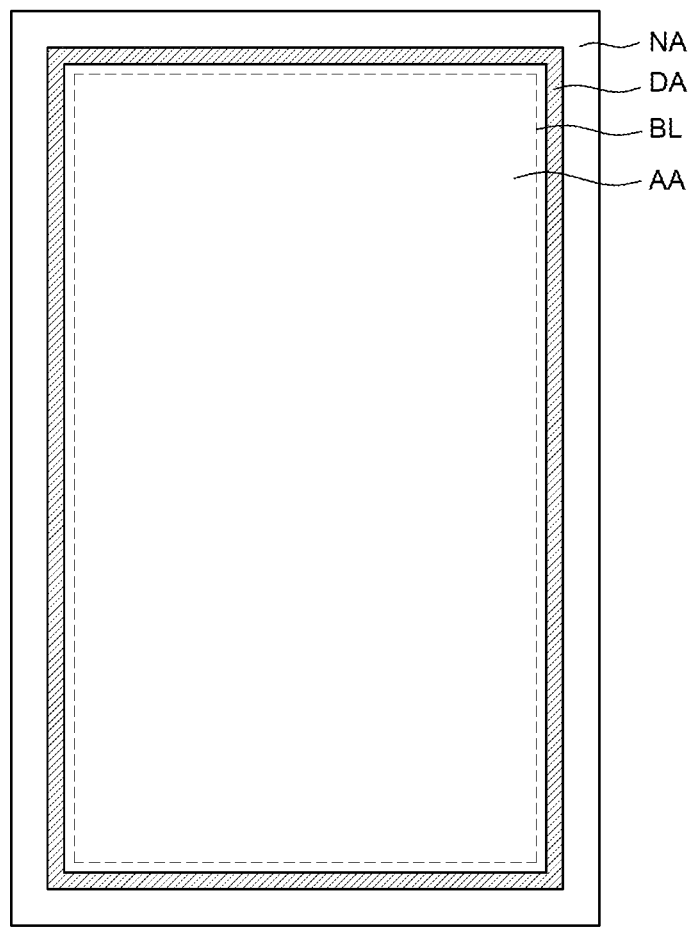
FIG. 2 is a view schematically illustrating a display panel of the touch screen integrated light-emitting display device according to the embodiments of the present specification.

FIG. 2 is a view schematically illustrating the display panel DISP of the touch screen integrated light-emitting display device according to the embodiments of the present specification.

With reference to FIG. 2, the display panel DISP may include an active area AA in which images are displayed, and a non-active area NA that is an outer peripheral area of a boundary line BL of an outer periphery of the active area AA.

The plurality of subpixels for the image display is arranged in the active area AA of the display panel DISP. Various types of electrodes or signal lines for the display operation are disposed in the active area.

In addition, the plurality of touch electrodes for the touch sensing and the plurality of touch routing lines electrically connected to the plurality of touch electrodes may be disposed in the active area AA of the display panel DISP. Therefore, the active area AA may be referred to as a touch sensing area that enables the touch sensing.

Link lines extending from various types of signal lines disposed in the active area AA may be disposed in the non-active area NA of the display panel DISP. Alternatively, link lines, which are electrically connected to various types of signal lines disposed in the active area AA, and pads, which are electrically connected to the link lines, may be disposed in the non-active area NA of the display panel DISP. The pads disposed in the non-active area NA may be bonded or electrically connected to the display drive circuits (DDC, GDC, and the like).

In addition, the link lines extending from the plurality of touch routing lines disposed in the active area AA or the link lines electrically connected to the plurality of touch routing lines disposed in the active area AA and the pads electrically connected to the link lines may be disposed in the non-active area NA of the display panel DISP. The pads disposed in the non-active area NA may be bonded or electrically connected to the touch drive circuit TDC.

A portion expanded from a part of an outermost peripheral touch electrode, among the plurality of touch electrodes disposed in the active area AA, may be present in the non-active area NA. One or more electrodes (touch electrodes) made of the same material of the plurality of touch electrodes disposed in the active area AA may be disposed in the non-active area NA.

That is, all the plurality of touch electrodes disposed in the display panel DISP may be present in the active area AA. Alternatively, some (e.g., the outermost peripheral touch electrodes) of the plurality of touch electrodes disposed in the display panel DISP may be present in the non-active area NA. Alternatively, some (e.g., the outermost peripheral touch electrodes) of the plurality of touch electrodes disposed in the display panel DISP may be present over the active area AA and the non-active area NA.

Meanwhile, with reference to FIG. 2, the display panel DISP of the touch screen integrated light-emitting display device according to the embodiments of the present specification may include a dam area DA in which a dam DAM is disposed to inhibit any layer (e.g., an encapsulation part on the organic light-emitting display panel) in the active area AA from being collapsed. That is, the dam DAM may serve to inhibit an organic material layer included in an encapsulation part ENCAP from overflowing to the outer periphery. Therefore, the dam DAM may be referred to as a blocking structure.

The dam area DA may be positioned at a boundary point between the active area AA and the non-active area NA or at any one point in the non-active area NA that is the outer peripheral area of the active area AA.

The dam disposed in the dam area DA may be disposed while surrounding the active area AA in all horizontal directions. Alternatively, the dam may be disposed only at an outer peripheral portion of one or more parts (e.g., a portion where a layer, which is easily collapsed, is present) of the active area AA. It should be understood that "surrounding . . . in all horizontal directions" may include the meaning of surrounding in lateral directions (e.g., front, back, left and right) and not surrounding in vertical directions (e.g., top and bottom). For example, dam(s) in the dam area DA can "surround" the display area on at least four sides (e.g., front, back, left and right sides) and not surround the display on the top and bottom sides).

The dam disposed in the dam area DA may have a single pattern continuously connected or disconnected two or more patterns. In addition, only a primary dam may be disposed in the dam area DA. Two dams (the primary dam and a secondary dam) may be disposed in the dam area DA. Three or more dams may be disposed in the dam area DA.

Only the primary dam may be disposed in any one direction in the dam area DA. Alternatively, both the primary dam and the secondary dam may be disposed in another direction.

Figure 3:
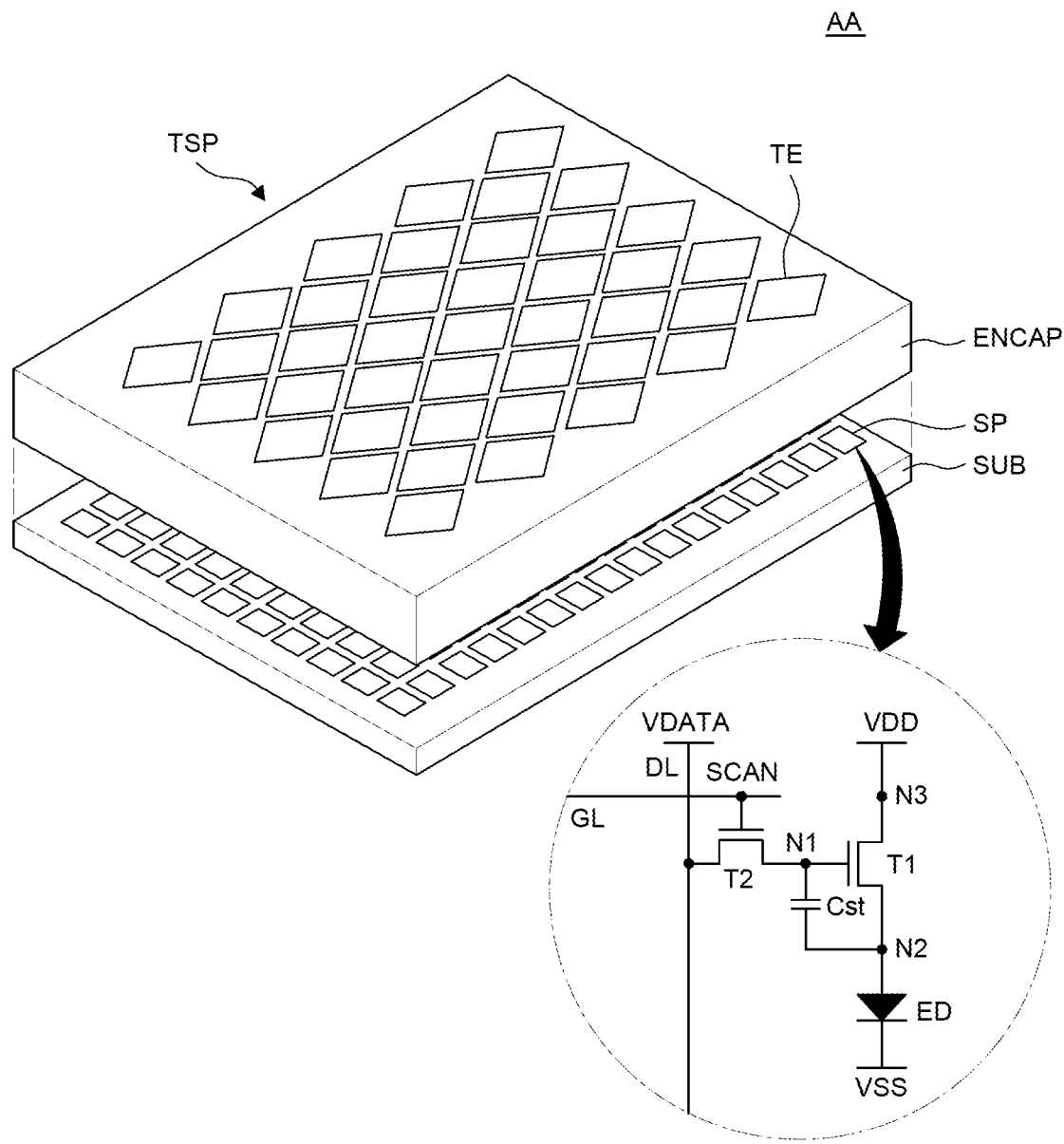
FIG. 3 is a view exemplarily illustrating a structure in which a touch panel embedded in the display panel according to the embodiments of the present specification.

FIG. 3 is a view exemplarily illustrating a structure in which the touch panel TSP embedded in the display panel DISP according to the embodiments of the present specification.

With reference to FIG. 3, a plurality of subpixels SP is arranged on a substrate SUB in the active area AA of the display panel DISP.

The subpixels SP may each include a light-emitting element ED, a first transistor T1 configured to operate the light-emitting element ED, a second transistor T2 configured to transmit data voltage VDATA to a first node N1 of the first transistor T1, and a storage capacitor Cst configured to maintain a predetermined or selected voltage for one frame.

The first transistor T1 may include the first node N1 to which the data voltage VDATA may be applied, a second node N2 electrically connected to the light-emitting element ED, and a third node N3 to which a drive voltage VDD is applied from a drive voltage line DVL. The first node N1 may be a gate node, the second node N2 may be a source node or drain node, and the third node N3 may be a drain node or source node. The first transistor T1 may be a driving transistor for operating the light-emitting element ED.

The light-emitting element ED may include a first electrode (e.g., an anode electrode), a light-emitting layer, and a second electrode (e.g., a cathode electrode). The first electrode may be electrically connected to the second node N2 of the first transistor T1, and a base voltage VSS may be applied to the second electrode.

The light-emitting layer of the light-emitting element ED may be an organic light-emitting layer made of an organic material. In this case, the light-emitting element ED may be an organic light-emitting diode (OLED).

The ON/OFF process of the second transistor T2 is controlled by a scan signal SCAN applied through a gate line GL. The gate line GL may be electrically connected between the first node N1 of the first transistor T1 and a data line DL. The second transistor T2 is also referred to as a switching transistor.

When the second transistor T2 is turned on by the scan signal SCAN, the second transistor T2 transmits the data voltage VDATA, which is supplied from the data line DL, to the first node N1 of the first transistor T1.

The storage capacitor Cst may be electrically connected between the first node N1 and the second node N2 of the first transistor T1.

As illustrated in FIG. 3, the subpixels SP may each have a 2T1C structure including two transistors T1 and T2 and a single capacitor Cst. In some instances, the subpixel SP may further include one or more transistors or further include one or more capacitors.

The storage capacitor Cst is not a parasitic capacitor (e.g., Cgs or Cgd) that is an internal capacitor that may be present between the first node N1 and the second node N2 of the first transistor T1. However, the storage capacitor Cst may be an external capacitor intentionally designed outside the first transistor T1.

The first transistor T1 and the second transistor T2 may each be an n-type transistor or a p-type transistor.

Meanwhile, as described above, the circuit elements such as the light-emitting element ED, the two or more transistors T1 and T2, and the one or more capacitors Cst are disposed on the display panel DISP. The circuit element (particularly, the light-emitting element ED) is vulnerable to outside moisture or oxygen. Therefore, the encapsulation part ENCAP may be disposed on the display panel DISP in order to inhibit outside moisture or oxygen from penetrating into the circuit element (particularly, the light-emitting element ED).

The encapsulation part ENCAP may be configured as a single or a plurality of layers.

Meanwhile, in the touch screen integrated light-emitting display device according to the embodiments of the present specification, the touch panel TSP may be formed on the encapsulation part ENCAP.

That is, in the touch screen integrated light-emitting display device, a touch sensor structure, such as a plurality of touch electrodes TE constituting the touch panel TSP, may be disposed on the encapsulation part ENCAP.

The touch driving signal or the touch sensing signal may be applied to the touch electrode TE during the touch sensing. Therefore, unnecessary parasitic capacitance may occur because a potential difference occurs between the touch electrode TE and the cathode electrode disposed with the encapsulation part ENCAP interposed therebetween during the touch sensing. The parasitic capacitance may degrade the touch sensitivity. Therefore, to reduce the parasitic capacitance, a distance between the touch electrode TE and the cathode electrode may be designed to have a predetermined or selected value (e.g., 1 micrometer or "μm") or more in consideration of a panel thickness, a panel manufacturing process, display performance, and the like. To this end, a thickness of the encapsulation part ENCAP may be at least 1 μm or more.

Figure 4:
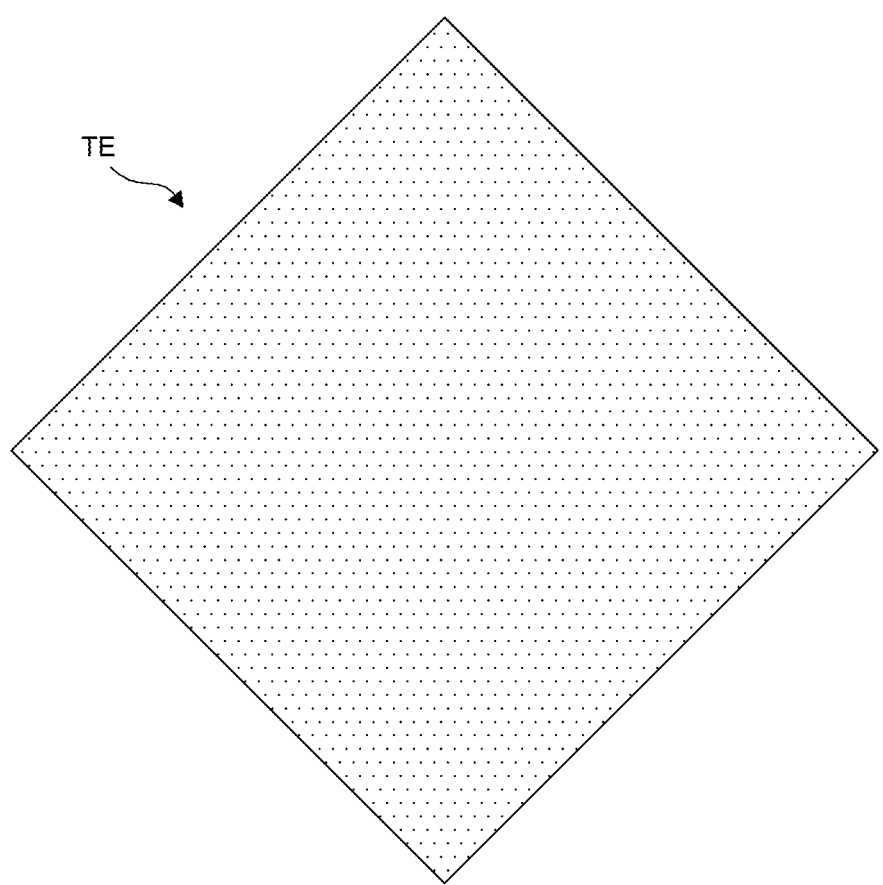
FIGS. 4 and 5 are views exemplarily illustrating types of touch electrodes disposed on the display panel according to the embodiments of the present specification.
Figure 5:
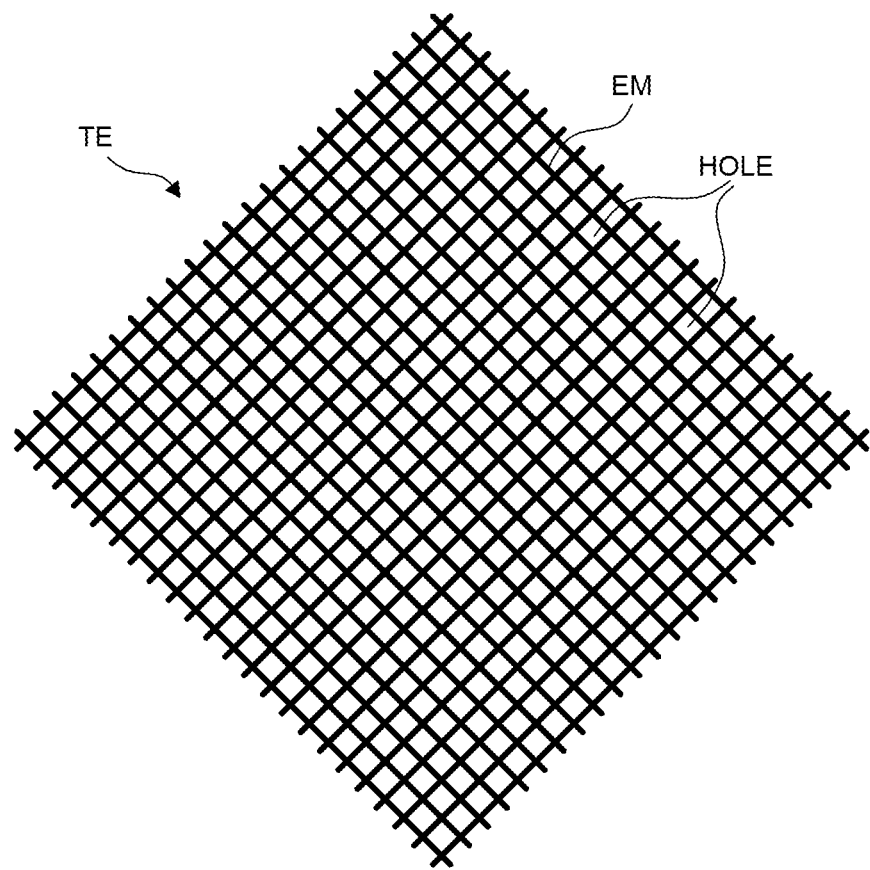

FIGS. 4 and 5 are views exemplarily illustrating types of touch electrodes TE disposed on the display panel DISP according to the embodiments of the present specification.

As illustrated in FIG. 4, each of the touch electrodes TE disposed on the display panel DISP may be an electrode metal having a plate shape having no hole. In this case, each of the touch electrodes TE may be a transparent electrode. That is, the touch electrodes TE may each be made of a transparent electrode material so that light beams emitted from the plurality of subpixels SP disposed below the touch electrodes TE may propagate upward while passing through the touch electrodes TE.

Alternatively, as illustrated in FIG. 5, each of the touch electrodes TE disposed on the display panel DISP may be an electrode metal EM having two or more holes by being patterned in a mesh shape.

The electrode metal EM may be a portion substantially corresponding to the touch electrode TE. The electrode metal EM may be a portion to which the touch driving signal is applied or in which the touch sensing signal is detected.

As illustrated in FIG. 5, in the case in which each of the touch electrodes TE is an electrode metal EM patterned in a mesh shape, two or more holes HOLE may be present in the area of the touch electrode TE.

The two or more holes HOLE present in each of the touch electrodes TE may correspond to the light-emitting areas of the one or more subpixels SP. That is, the plurality of holes is routes through which the light beams emitted from the plurality of subpixels SP disposed below the touch electrodes propagate upward. Hereinafter, for convenience of description, an example will be described in which each of the touch electrodes TE is the mesh-type electrode metal EM.

The electrode metal EM corresponding to each of the touch electrodes TE may be positioned on a bank disposed in an area that is not the light-emitting areas of the two or more subpixels SP.

Meanwhile, the method of forming several touch electrodes TE may form the several touch electrodes TE by widely forming the electrode metal EM in a mesh shape, cutting the electrode metal EM in a predetermined or selected pattern, and electrically separating the electrode metals EM.

As illustrated in FIGS. 4 and 5, an outer peripheral shape of the touch electrode TE may be a quadrangular shape such as a diamond or rhombic shape or various shapes such as a triangular, pentagonal, or hexagonal shape.

Figure 6:
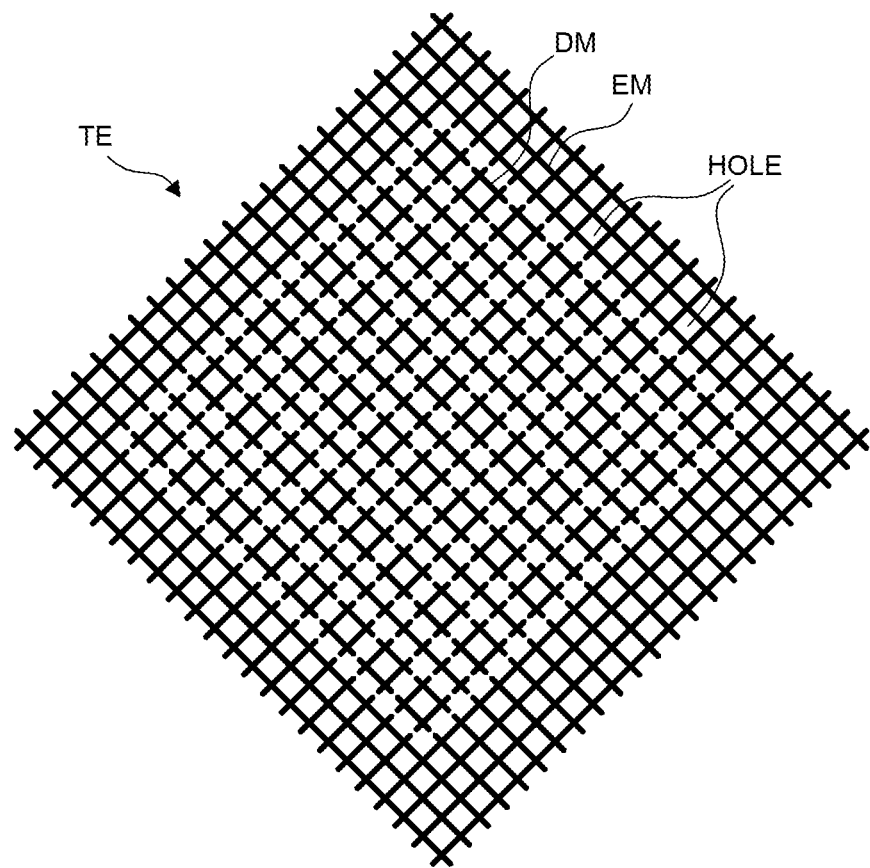
FIG. 6 is a view exemplarily illustrating a mesh-type touch electrode in FIG. 5.

FIG. 6 is a view exemplarily illustrating a mesh-type touch electrode TE in FIG. 5.

With reference to FIG. 6, one or more dummy metals DM disposed in the area of each of the touch electrodes TE and disconnected from the mesh-type electrode metal EM.

The electrode metal EM may be a portion substantially corresponding to the touch electrode TE. The electrode metal EM may be a portion to which the touch driving signal is applied or in which the touch sensing signal is detected. However, the dummy metal DM may be a portion present in the area of the touch electrode TE. However, the dummy metal DM may be a portion to which no touch driving signal is applied and in which no touch sensing signal is detected. That is, the dummy metal DM may be an electrically floating metal.

Therefore, the electrode metal EM may be electrically connected to the touch drive circuit TDC. However, the dummy metal DM is not electrically connected to the touch drive circuit TDC.

In the entire areas of all the touch electrodes TE, one or more dummy metals DM may be present in a state in which the dummy metals DM are disconnected from the electrode metal EM.

Alternatively, only in the areas of some of the touch electrodes TE, among the all the touch electrodes TE, one or more dummy metals DM may be present in a state in which the dummy metals DM are disconnected from the electrode metal EM. That is, no dummy metal DM may be present in the areas of the some of the touch electrodes TE.

Meanwhile, as illustrated in FIG. 5, regarding the function of the dummy metal DM, there may occur an issue in that a contour of the electrode metal EM is visible on a screen when only the electrode metal EM is provided in a mesh shape without one or more dummy metals DM in the area of the touch electrode TE.

In contrast, as illustrated in FIG. 6, when the one or more dummy metals DM are present in the area of the touch electrode TE, it is possible to solve the issue in that the contour of the electrode metal EM is visible on the screen.

In addition, the touch sensitivity may be improved by adjusting a magnitude of capacitance for each of the touch electrodes TE by adjusting the presence or absence of the dummy metal DM or the number of dummy metals DM (a ratio of the dummy metal) for each of the touch electrodes TE.

Meanwhile, the cut electrode metal EM may be formed as the dummy metal DM by cutting some points of the electrode metal EM formed in the area of the single touch electrode TE. That is, the electrode metal EM and the dummy metal DM may be formed on the same layer and made of the same material.

Meanwhile, the touch screen integrated light-emitting display device according to the embodiments of the present specification may sense the touch on the basis of capacitance occurring on the touch electrode TE.

The touch screen integrated light-emitting display device according to the embodiments of the present specification may sense the touch by using a touch sensing method based on mutual-capacitance, as a touch sensing method based on capacitance. Alternatively, the touch screen integrated light-emitting display device may sense the touch by using a touch sensing method based on self-capacitance.

In the case of the touch sensing method based on mutual-capacitance, the plurality of touch electrodes TE may include a drive touch electrode (transmitting/receiving touch electrode) to which the touch driving signal is applied, and a sensing touch electrode (receiving touch electrode) configured to detect the touch sensing signal and form capacitance together with the drive touch electrode.

In the case of the touch sensing method based on the mutual-capacitance, the touch sensing circuit TSC senses the touch coordinate and/or whether the touch is made on the basis of a change in capacitance (mutual-capacitance) between the drive touch electrode and the sensing touch electrode in accordance with the presence or absence of a pointer such as a finger or a pen.

In the case of the touch sensing method based on self-capacitance, each of the touch electrodes TE serves as both the drive touch electrode and the sensing touch electrode. That is, the touch sensing circuit TSC applies the touch driving signal to the one or more touch electrodes TE and detects the touch sensing signal through the touch electrode TE to which the touch driving signal is applied. Further, based on the detected touch sensing signal, the touch sensing circuit TSC senses the touch coordinate and/or whether the touch is made by recognizing a change in capacitance between the touch electrode TE and the pointer such as the finger or the pen. In the case of the touch sensing method based on the self-capacitance, there is no difference between the drive touch electrode and the sensing touch electrode.

As described above, the touch screen integrated light-emitting display device according to the embodiments of the present specification may sense the touch by using a touch sensing method based on mutual-capacitance. Alternatively, the touch screen integrated light-emitting display device may sense the touch by using a touch sensing method based on self-capacitance. However, hereinafter, for convenience of description, an example will be described in which the touch screen integrated light-emitting display device performs the touch sensing based on mutual-capacitance and has the touch sensor structure to perform the touch sensing based on mutual-capacitance.

Figure 7:
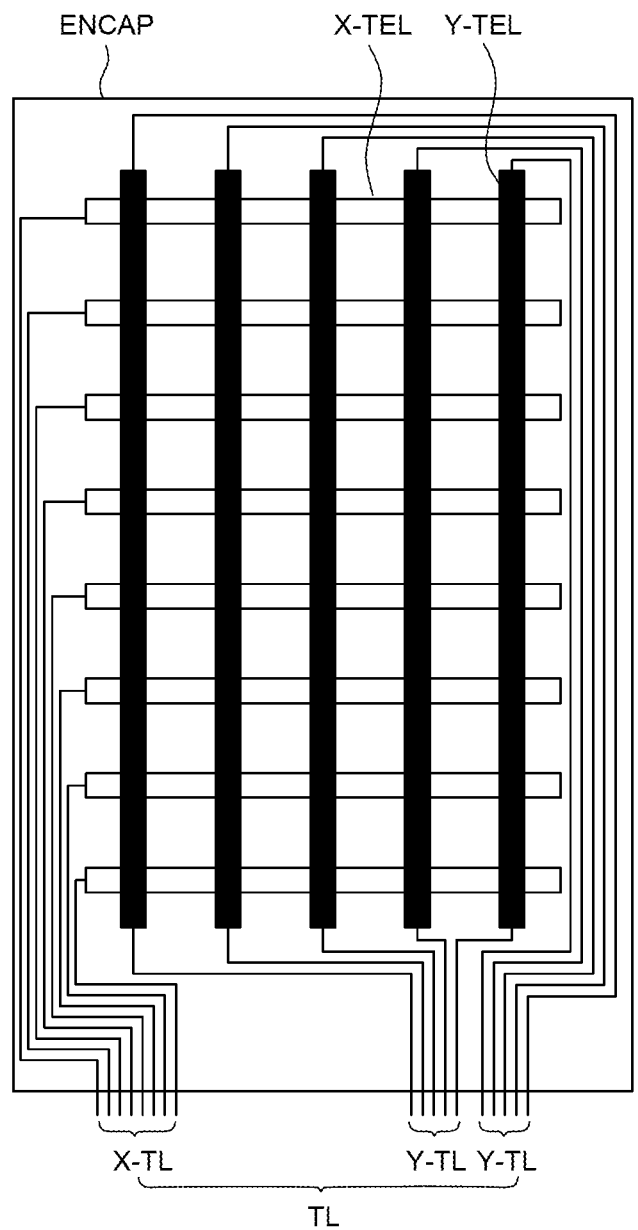
FIG. 7 is a view briefly illustrating a touch sensor structure on the display panel according to the embodiments of the present specification.
Figure 8:
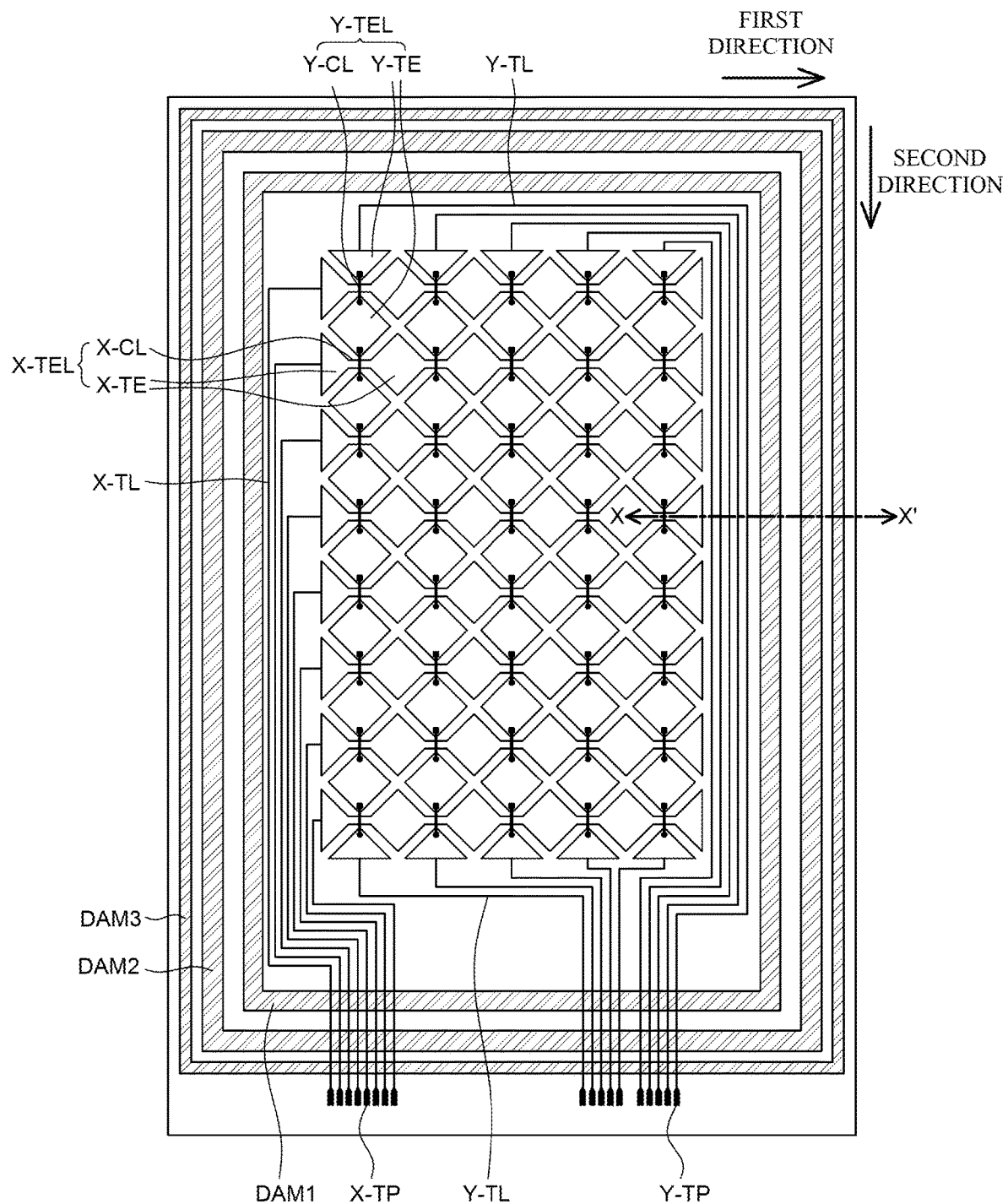
FIG. 8 is a view illustrating an implementation example of the touch sensor structure in FIG. 7.

FIG. 7 is a view briefly illustrating the touch sensor structure on the display panel DISP according to the embodiments of the present specification, and FIG. 8 is a view illustrating an implementation example of the touch sensor structure in FIG. 7.

With reference to FIGS. 7 and 8, the touch sensor structure for performing the touch sensing based on mutual-capacitance may include a plurality of X-touch electrode lines X-TEL and a plurality of Y-touch electrode lines Y-TEL. In this case, the plurality of X-touch electrode lines X-TEL and the plurality of Y-touch electrode lines Y-TEL are positioned on the encapsulation part ENCAP. The X-touch electrode line may be referred to as a first touch electrode line, and the Y-touch electrode line may be referred to as a second touch electrode line.

The plurality of X-touch electrode lines X-TEL may be disposed in a first direction, and the plurality of Y-touch electrode lines Y-TEL may be disposed in a second direction different from the first direction.

In the present specification, the first direction and the second direction may be relatively different directions. For example, the first direction may be an x-axis direction, and the second direction may be a y-axis direction. On the contrary, the first direction may be the y-axis direction, and the second direction may be the x-axis direction. In addition, the first direction and the second direction may be orthogonal to each other but may not be orthogonal to each other. In addition, in the present specification, the row and column are relative factors, and the row and column may change to each other depending on the standpoint.

The plurality of X-touch electrode lines X-TEL may include several X-touch electrodes X-TE electrically connected. The plurality of Y-touch electrode lines Y-TEL may include several Y-touch electrodes Y-TE electrically connected. The X-touch electrode may be referred to as a first touch electrode, and the Y-touch electrode may be referred to as a second touch electrode.

The plurality of X-touch electrodes X-TE and the plurality of Y-touch electrodes Y-TE are electrodes included in the plurality of touch electrodes TE and distinguished in terms of functions.

For example, the plurality of X-touch electrodes X-TE constituting the plurality of X-touch electrode lines X-TEL may be the drive touch electrodes. The plurality of Y-touch electrodes Y-TE constituting the plurality of Y-touch electrode lines Y-TEL may be the sensing touch electrodes. In this case, the plurality of X-touch electrode lines X-TEL is each the drive touch electrode line. The plurality of Y-touch electrode lines Y-TEL is each the sensing touch electrode line.

As another example, the plurality of X-touch electrodes X-TE constituting the plurality of X-touch electrode lines X-TEL may be the sensing touch electrodes. The plurality of Y-touch electrodes Y-TE constituting the plurality of Y-touch electrode lines Y-TEL may be the drive touch electrodes. In this case, the plurality of X-touch electrode lines X-TEL is each the sensing touch electrode line. The plurality of Y-touch electrode lines Y-TEL is each the drive touch electrode line.

The touch sensor metal for the touch sensing may include a plurality of touch routing lines TL in addition to the plurality of X-touch electrode lines X-TEL and the plurality of Y-touch electrode lines Y-TEL.

The plurality of touch routing lines TL may include one or more X-touch routing lines X-TL respectively connected to the plurality of X-touch electrode lines X-TEL, and one or more Y-touch routing lines Y-TL respectively connected to the plurality of Y-touch electrode lines Y-TEL.

The plurality of X-touch electrode lines X-TEL may include the plurality of X-touch electrodes X-TE disposed in the same row (or column), and one or more X-touch electrode connection lines X-CL configured to electrically connect the plurality of X-touch electrodes X-TE. In this case, the X-touch electrode connection line X-CL, which connects the two adjacent X-touch electrodes X-TE, may be a metal integrated with the two adjacent X-touch electrodes X-TE (see the example in FIG. 8) or a metal connected to the two adjacent X-touch electrodes X-TE through a contact hole.

The plurality of Y-touch electrode lines Y-TEL may include the plurality of Y-touch electrodes Y-TE disposed in the same column (or row), and one or more Y-touch electrode connection lines Y-CL configured to electrically connect the plurality of Y-touch electrodes Y-TE. In this case, the Y-touch electrode connection line Y-CL, which connects the two adjacent Y-touch electrodes Y-TE, may be a metal integrated with the two adjacent Y-touch electrodes Y-TE or a metal connected to the two adjacent Y-touch electrodes Y-TE through a contact hole (see the example in FIG. 8).

In the area in which the X-touch electrode line X-TEL and the Y-touch electrode line Y-TEL overlap each other (touch electrode line overlap area), the X-touch electrode connection line X-CL and the Y-touch electrode connection line Y-CL may overlap each other.

In this case, in the area in which the X-touch electrode line X-TEL and the Y-touch electrode line Y-TEL overlap each other (touch electrode line overlap area), the X-touch electrode connection line X-CL and the Y-touch electrode connection line Y-CL may overlap each other.

When the X-touch electrode connection line X-CL and the Y-touch electrode connection line Y-CL overlap each other in the touch electrode line overlap area as described above, the X-touch electrode connection line X-CL and the Y-touch electrode connection line Y-CL need to be positioned on different layers.

Therefore, the plurality of X-touch electrodes X-TE, the plurality of X-touch electrode connection lines X-CL, the plurality of Y-touch electrodes Y-TE, the plurality of Y-touch electrode lines Y-TEL, the plurality of Y-touch electrode connection lines Y-CL may be positioned on two or more layers so that the plurality of X-touch electrode lines X-TEL and the plurality of Y-touch electrode lines Y-TEL are disposed to overlap one another. The X-touch electrode connection line may be referred to as a first touch electrode connection line, and the Y-touch electrode connection line may be referred to as a second touch electrode connection line.

The plurality of X-touch electrode lines X-TEL is each electrically connected to the corresponding X-touch pad X-TP through the one or more X-touch routing lines X-TL. That is, the X-touch electrode X-TE, which is disposed at an outermost periphery among the plurality of X-touch electrodes X-TE included in one X-touch electrode line X-TEL, is electrically connected to the corresponding X-touch pad X-TP through the X-touch routing line X-TL.

The plurality of Y-touch electrode lines Y-TEL is each electrically connected to the corresponding Y-touch pad Y-TP through the one or more Y-touch routing lines Y-TL.

That is, the Y-touch electrode Y-TE, which is disposed at an outermost periphery among the plurality of Y-touch electrodes Y-TE included in one Y-touch electrode line Y-TEL, is electrically connected to the corresponding Y-touch pad Y-TP through the Y-touch routing line Y-TL.

The plurality of X-touch electrode lines X-TEL and the plurality of Y-touch electrode lines Y-TEL may be disposed on the encapsulation part ENCAP. That is, the plurality of X-touch electrode connection lines X-CL and the plurality of X-touch electrodes X-TE constituting the plurality of X-touch electrode lines X-TEL may be disposed on the encapsulation part ENCAP. The plurality of Y-touch electrode connection lines Y-CL and the plurality of Y-touch electrodes Y-TE constituting the plurality of Y-touch electrode lines Y-TEL may be disposed on the encapsulation part ENCAP.

The plurality of X-touch routing lines X-TL electrically connected to the plurality of X-touch electrode lines X-TEL may be disposed on the encapsulation part ENCAP and extend to a portion where no encapsulation part ENCAP is provided. Further, the plurality of X-touch routing lines X-TL may be electrically connected to the plurality of X-touch pads X-TP. The plurality of Y-touch routing lines Y-TL electrically connected to the plurality of Y-touch electrode lines Y-TEL may be disposed on the encapsulation part ENCAP and extend to the portion where no encapsulation part ENCAP is provided. Further, the plurality of Y-touch routing lines Y-TL may be electrically connected to the plurality of Y-touch pads Y-TP. In this case, the encapsulation part ENCAP may be positioned in the active area AA. In some instances, the encapsulation part ENCAP may be expanded to the non-active area NA.

Meanwhile, as described above, the dam area (the dam area DA in FIG. 2) may be present in the non-active area NA, which is a boundary area between the active area AA and the non-active area NA or an outer peripheral area of the active area AA to inhibit any layer in the active area AA (e.g., the encapsulation part of the organic light-emitting display panel) from being collapsed. That is, the dam DAM may inhibit an organic material layer included in an encapsulation part ENCAP from overflowing to the outer periphery. Therefore, the dam DAM may be referred to as a blocking structure.

One or more dams DAM may be disposed in the dam area DA. For example, a primary dam DAM1 and a secondary dam DAM2 may be disposed on the dam area DA, and the secondary dam DAM2 may be positioned to be closer to the outer periphery than the primary dam DAM1 to the outer periphery. For example, the primary dam DAM1, the secondary dam DAM2, and a tertiary dam DAM3 may be disposed in the dam area DA. The dam may be positioned to be closer to the outer periphery as the order thereof increases.

Figure 9:
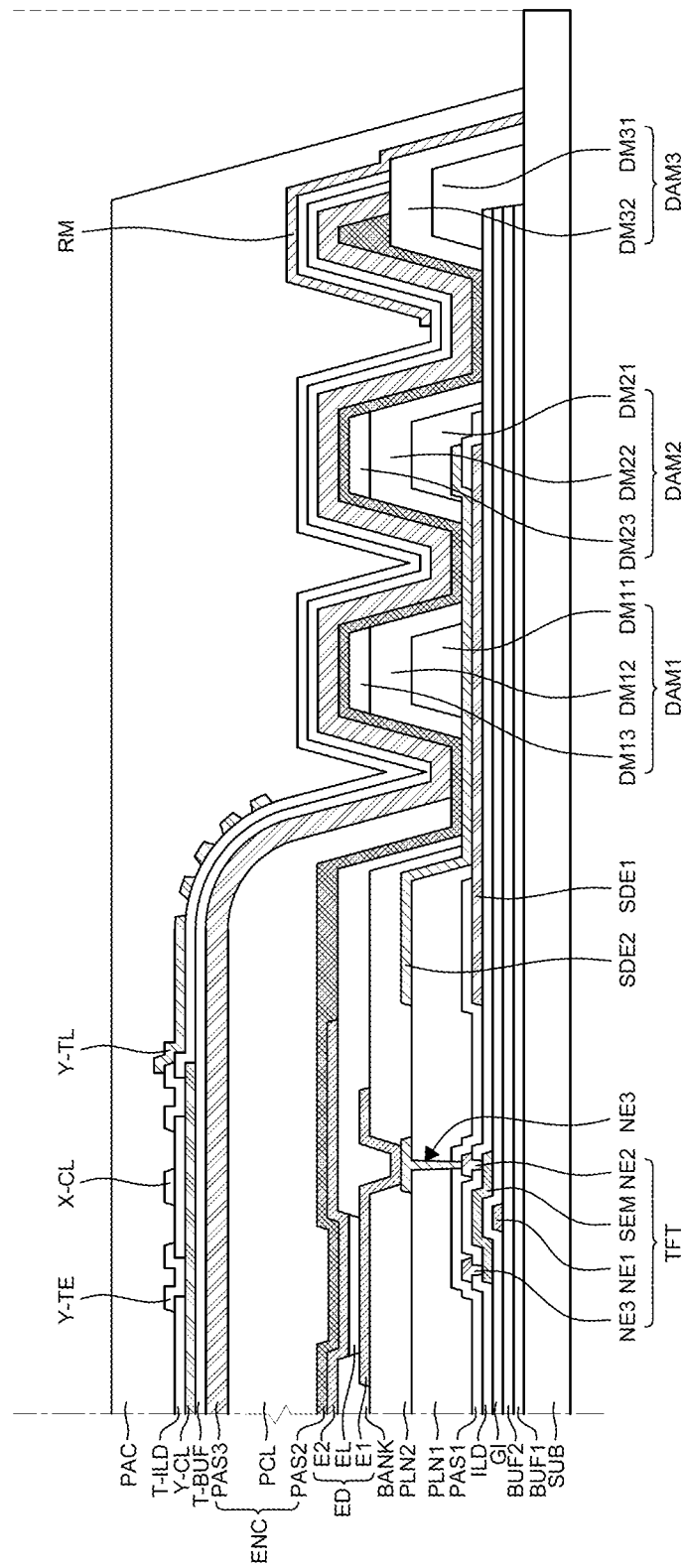
FIG. 9 is an exemplary cross-sectional view taken along line X-X' and illustrating the display panel according to the embodiments.

FIG. 9 is an exemplary cross-sectional view taken along line X-X' and illustrating the display panel according to the embodiments.

With reference to FIGS. 8 and 9, buffers or "buffer layers" BUF1 and BUF2, which are each configured as a single-layer or multilayer structure, may be disposed on the substrate SUB. The substrate SUB may be made of a flexible material. In case that the substrate SUB is made of a material such as polyimide, the buffers BUF1 and BUF2 may each be configured as a single layer or multilayer made of at least one of an inorganic material and an organic material to inhibit the light-emitting element ED from being damaged by impurities such as alkaline ions leaking from the substrate SUB during a subsequent process.

The inorganic material, which constitutes the buffers BUF1 and BUF2, may include any one of a silicon oxide film (SiOx), a silicon nitride film (SiNx), and a silicon oxidation nitride film (SiON). The organic material, which constitutes the buffers BUF1 and BUF2, may include any one of polyimide, benzocyclobutene series resin, and polyacrylate. Examples of polyacrylate may include photoacryl.

A driving transistor TFT for operating the subpixel may be disposed in the active area of the substrate SUB. The driving transistor TFT includes a first node electrode NE1 corresponding to the gate electrode, a second node electrode NE2 corresponding to the source electrode or the drain electrode, and a third node electrode NE3 corresponding to the drain electrode or the source electrode, and a semiconductor layer SEM.

The first node electrode NE1 and the semiconductor layer SEM may overlap each other with a gate insulation film GI interposed therebetween. The second node electrode NE2 may be formed on an insulation layer and be in contact with the other side of the semiconductor layer SEM.

An insulation layer ILD may be disposed on the gate insulation layer GI. The insulation layer ILD may be configured as a single layer made of an inorganic material, or a multilayer made of different inorganic materials. For example, the insulation layer ILD may be configured as a single layer or multilayer made of any one of silicon oxide film (SiOx), silicon nitride film (SiNx), and silicon oxidation nitride film (SiON).

A protective layer PAS1 may be disposed on the first node electrode NE1 and the second node electrode NE2. The protective layer PAS1 may serve to protect the driving transistor TFT and be made of silicon oxide (SiOx), silicon nitride (SiNx), or a multilayer thereof, for example.

Planarization layers PLN1 and PLN2 may be disposed on the protective layer PAS1. The planarization layers PLN1 and PLN2 may serve to protect a lower structure while mitigating a level difference of the lower structure and be made of an organic material. The organic material may include any one of polyimide, benzocyclobutene series resin, and polyacrylate. Examples of polyacrylate may include photoacryl.

The planarization layers PLN1 and PLN2 may include a first planarization layer PLN1 and a second planarization layer PLN2. The first planarization layer PLN1 may be disposed on the protective layer PAS1, and the second planarization layer PLN2 may be disposed on the first planarization layer PLN1. A connection electrode CE may be electrically connected to the source electrode through a contact hole formed in the first planarization layer PLN1. The connection electrode CE serves to electrically connect the driving transistor TFT and a first electrode E1 of the light-emitting element ED. The connection electrode CE may be made of an electrically conductive material, for example, copper (Cu), aluminum (Al), molybdenum (Mo), nickel (Ni), titanium (Ti), chromium (Cr), or an alloy thereof. However, the present disclosure is not limited thereto.

The light-emitting element ED may include the first electrode E1 corresponding to the anode electrode, a light-emitting layer EL formed on the first electrode E1, and a second electrode E2 formed on the light-emitting layer EL and corresponding to the cathode electrode. The first electrode E1 is electrically connected to the second node electrode NE2 of the driving transistor TFT through pixel contact holes formed through the planarization layers PLN1 and PLN2. A bank BANK, which exposes the first electrode E1, may be formed on the planarization layers PLN1 and PLN2. The bank BANK may have an opening portion, and the first electrode E1 may be exposed through the opening portion. The opening portion of the bank BANK may be an area that defines the light-emitting area or exposes a portion of the light-emitting layer EL that is in the light-emitting area. The bank BANK may be made of an organic material such as polyimide, benzocyclobutene series resin, and polyacrylate.

The light-emitting layer EL is formed on the first electrode E1 in the light-emitting area provided by the bank BANK. The light-emitting layer EL is formed by stacking a positive hole-related layer, the light-emitting layer EL, and an electron-related layer on the first electrode E1 in this order or the reverse order. The second electrode E2 is formed to face the first electrode E1 with the light-emitting layer EL interposed therebetween.

The encapsulation part ENCAP inhibits outside moisture or oxygen from penetrating into the light-emitting element ED vulnerable to outside moisture or oxygen. The encapsulation part ENCAP may be configured as a single layer or a plurality of layers. For example, in case that the encapsulation part ENCAP is configured as a plurality of layers, the encapsulation part ENCAP may include one or more inorganic encapsulation layers, and one or more organic encapsulation layers PCL. In detail, the encapsulation part ENCAP may have a structure in which a first inorganic encapsulation layer PAS2, the organic encapsulation layer PCL, and a second inorganic encapsulation layer PAS3 are sequentially stacked. In this case, the organic encapsulation layer PCL may further include one or more organic encapsulation layers PCL or at least one inorganic encapsulation layer.

The first inorganic encapsulation layer PAS2 is formed on the substrate SUB on which the second electrode E2 corresponding to the cathode electrode is formed to be closest to the light-emitting element ED. For example, the first inorganic encapsulation layer PAS2 is made of an inorganic insulating material such as silicon nitride (SiNx), silicon oxide (SiOx), oxidation silicon nitride (SiON), or aluminum oxide ($Al_2O_3$) that may be deposited at a low temperature. Because the first inorganic encapsulation layer PAS2 is deposited at a low temperature, it is possible to suppress damage to the light-emitting layer EL including an organic material during a deposition process.

The organic encapsulation layer PCL may have a smaller area than the first inorganic encapsulation layer PAS2. In this case, the organic encapsulation layer PCL may be formed to expose two opposite ends of the first inorganic encapsulation layer PAS2. The organic encapsulation layer PCL may serve as a buffer for mitigating stress between the layers when the touch screen integrated light-emitting display device, which is the organic light-emitting display device, is bent. The organic encapsulation layer PCL may serve to improve the planarization performance. For example, the organic encapsulation layer PCL may be made of an organic insulating material such as acrylic resin, epoxy resin, polyimide, polyethylene, or siliconoxycarbon (SiOC).

In case that the organic encapsulation layer PCL is formed in an inkjet manner, one or more dams DAM1, DAM2, and DAM3 may be formed in the dam area (the dam area DA in FIG. 2) corresponding to the boundary area between the non-active area (the non-active area NA in FIG. 2) and the active area (the active area AA in FIG. 2) or corresponding to a partial area in the non-active area. For example, three dams DAM1, DAM2, and DAM3 may be formed in the dam area. The three dams DAM1, DAM2, and DAM3 may include the primary dam DAM1, the secondary dam DAM2, and the tertiary dam DAM3.

The dams DAM1, DAM2, and DAM3 serve to inhibit the organic encapsulation layer PCL included in the encapsulation part ENCAP from overflowing to the outer periphery. Therefore, the increase in heights of the dams DAM1, DAM2, and DAM3 may facilitate the function of controlling the overflow of the organic encapsulation layer PCL. However, in the display device of the embodiment in which the touch panel is integrally formed in the display panel, there may occur a defect in which a thickness of the line is decreased or the line is disconnected in a high-level difference area such as an area of a lower layer in which the dams DAM1, DAM2, and DAM3 are disposed at the time of forming the touch electrode or the touch routing line. Therefore, the heights of the dams DAM1, DAM2, and DAM3 may be adjusted to minimize or reduce the influence related to the formation of the touch electrode or the touch routing line. For example, the plurality of dams DAM1, DAM2, and DAM3 having small heights may be disposed. For example, the dam area may be positioned between the active area and the pad area in which a plurality of X-touch pads and a plurality of Y-touch pads are formed in the non-active area. In the dam area, there may be present the primary dam DAM1 disposed adjacent to the active area, the tertiary dam DAM3 disposed adjacent to the pad area, and the secondary dam DAM2 positioned between the primary dam DAM1 and the secondary dam DAM2.

The one or more dams DAM1, DAM2, and DAM3 disposed in the dam area may inhibit the liquid organic encapsulation layer PCL from being collapsed in a direction of the non-active area and invading the pad area when the liquid organic encapsulation layer PCL is dropped into the active area. This effect may be further improved when the primary dam DAM1, the secondary dam DAM2, and the tertiary dam DAM3 are provided.

At least one of the primary dam DAM1, the secondary dam DAM2, and the tertiary dam DAM3 may be configured as a single-layer or multilayer structure. For example, at least one of the primary dam DAM1, the secondary dam DAM2, and the tertiary dam DAM3 may be made of the same material as at least one of the planarization layers PLN1 and PLN2 and the bank BANK. In this case, the structures of the dams DAM1, DAM2, and DAM3 may be formed even though no mask is additionally used.

The primary dam DAM1 may include at least one of a first dam pattern DM11, a second dam pattern DM12, and a third dam pattern DM13. The first dam pattern DM11, the second dam pattern DM12, and the third dam pattern DM13 may be sequentially stacked. The first dam pattern DM11 may be made of the same material as the second planarization layer PLN2 and disposed at the same time when the second planarization layer PLN2 is disposed. The second dam pattern DM12 may be made of the same material as the bank BANK and disposed at the same time when the bank BANK is disposed. The third dam pattern DM13 may be made of a material identical or similar to the material of the bank BANK and disposed subsequently after the second dam pattern DM12 is disposed. The third dam pattern DM13 may be excluded, as beneficial.

The secondary dam DAM2 may include at least one of a first dam pattern DM21, a second dam pattern DM22, and a third dam pattern DM23. The first dam pattern DM21, the second dam pattern DM22, and the third dam pattern DM23 may be sequentially stacked. The first dam pattern DM21 may be made of the same material as the second planarization layer PLN2 and disposed at the same time when the second planarization layer PLN2 is disposed. The second dam pattern DM22 may be made of the same material as the bank BANK and disposed at the same time when the bank BANK is disposed. The third dam pattern DM23 may be made of a material identical or similar to the material of the bank BANK and disposed subsequently after the second dam pattern DM22 is disposed. The third dam pattern DM23 may be excluded, as beneficial.

The primary dam DAM1 and the secondary dam DAM2 may have substantially the same shape. However, the present disclosure is not limited thereto. The primary dam DAM1 may be disposed on basal electrodes SDE1 and SDE2, and the secondary dam DAM2 may be disposed on partial portions of the basal electrodes SDE1 and SDE2. The tertiary dam DAM3 may be disposed on the substrate and/or other layers (e.g., the buffer, the gate insulation layer, and the insulation layer) regardless of the basal electrodes SDE1 and SDE2. In addition, at least a part of the tertiary dam DAM3 may be disposed on insulating layer constituent elements such as the buffers BUF1 and BUF2, the gate insulation layer GI, and the insulation layer ILD. The remaining part of the tertiary dam DAM3 may be disposed on the substrate SUB.

Meanwhile, the basal electrodes SDE1 and SDE2 may be the low-potential voltage line or electrically connected to the low-potential voltage line. However, the present disclosure is not limited thereto. The basal electrodes SDE1 and SDE2 may include a first basal electrode SDE1 and a second basal electrode SDE2.

The first basal electrode SDE1 is disposed on the insulation layer ILD. A part of the second basal electrode SDE2 may be disposed on the first basal electrode SDE1, and the remaining part of the second basal electrode SDE2 may be disposed on the first planarization layer PLN1. The protective layer PAS1 may be disposed on an upper portion of the first basal electrode SDE1, and the protective layer PAS1 may cover a part of the first basal electrode SDE1. The second basal electrode SDE2 may be partially in contact with the first basal electrode SDE1. The remaining part of the second basal electrode SDE2 may be separated from the first basal electrode SDE1 by the protective layer PAS1. For example, the first basal electrode SDE1 and the second basal electrode SDE2 are disposed to be in contact with each other at a portion disposed below the dam (e.g., the primary dam DAM1 and the secondary dam DAM2). However, the first basal electrode SDE1 and the second basal electrode SDE2 may be separated at a portion disposed adjacent to the active area or the active area by the protective layer PAS1 and/or the first planarization layer PLN1.

The basal electrodes SDE1 and SDE2 may extend to the lower side of the secondary dam DAM2 or at least a part of the lower side of the secondary dam DAM2. However, the present disclosure is not limited thereto. For example, the basal electrodes SDE1 and SDE2 may extend to the lower side of the primary dam DAM1. For example, the basal electrodes SDE1 and SDE2 may extend to the lower side of the secondary dam DAM2. Meanwhile, the basal electrodes SDE1 and SDE2 may extend to the lower side of the tertiary dam DAM3.

In addition, the tertiary dam DAM3 may have a structure different from the structure of the primary dam DAM1 and the structure of the secondary dam DAM2. The tertiary dam may include at least one of a first dam pattern DM31 and a second dam pattern DM32. However, the tertiary dam may have no third dam patterns DM13 and DM23 provided on the primary dam DAM1 and the secondary dam DAM2. The second dam pattern DM32 and the first dam pattern DM31, which constitute the tertiary dam, may be sequentially stacked. The first dam pattern DM31 may be made of the same material as the second planarization layer PLN2 and disposed at the same time when the second planarization layer PLN2 is disposed. The second dam pattern DM32 may be made of the same material as the bank BANK and disposed at the same time when the bank BANK is disposed.

At least a part of the encapsulation part ENCAP may be disposed on the primary dam DAM1, the secondary dam DAM2, and the tertiary dam DAM3. The first inorganic insulation layer PAS2 and/or the second inorganic insulation layer PAS3 may be disposed on the primary dam DAM1, the secondary dam DAM2, and the tertiary dam DAM3. For example, the first inorganic insulation layer PAS2 and the second inorganic insulation layer PAS3 may be sequentially disposed on the primary dam DAM1, the secondary dam DAM2, and the tertiary dam DAM3.

A touch insulation layer T-ILD may be further stacked on the primary dam DAM1, the secondary dam DAM2, and the tertiary dam DAM3. For example, the touch insulation layer T-ILD disposed on the second inorganic encapsulation layer PAS3 may be disposed to extend to the dam area. In addition, a touch buffer T-BUF may be further stacked between the primary dam DAM1, the secondary dam DAM2, the tertiary dam DAM3, and the touch insulation layer T-ILD. For example, the touch buffer T-BUF may be disposed to extend to the dam area.

The first inorganic encapsulation layer PAS2, the second inorganic encapsulation layer PAS3, the touch buffer T-BUF, and the touch insulation layer T-ILD may be disposed to cover a top surface and a side surface of the primary dam DAM1 and a top surface and a side surface of the secondary dam DAM2. The first inorganic encapsulation layer PAS2, the second inorganic encapsulation layer PAS3, the touch buffer T-BUF, and the touch insulation layer T-ILD may be disposed to partially cover the tertiary dam DAM3. However, the present disclosure is not limited thereto. For example, in the case of the tertiary dam DAM3, the first inorganic encapsulation layer PAS2, the second inorganic encapsulation layer PAS3, the touch buffer T-BUF, and the touch insulation layer T-ILD may be disposed on the top surface and the side surface positioned at the inner side, and the first inorganic encapsulation layer PAS2, the second inorganic encapsulation layer PAS3, the touch buffer T-BUF, and the touch insulation layer T-ILD may not be disposed on the top surface and the side surface positioned at the outer side.

As described below, the touch screen integrated light-emitting display device according to various embodiments of the present specification includes the touch sensor metal. A reflective metal RM, which is made of the same material as the touch sensor metal, may be disposed on an upper portion of at least one of the primary dam DAM1, the secondary dam DAM2, and the tertiary dam DAM3. The touch sensor metal may be stacked by substantially the same process as the reflective metal.

For example, the reflective metal RM, which is made of substantially the same material as the touch sensor metal, may be disposed while being integrated with the upper portion of at least one of the primary dam DAM1, the secondary dam DAM2, and the tertiary dam DAM3. The reflective metal RM may be disposed to integrally cover the top surfaces and the side surfaces of the primary dam DAM1, the secondary dam DAM2, and the tertiary dam DAM3. The reflective metal RM may serve to reflect light, which is introduced inward from the outer periphery of the display device, in an outward direction. Therefore, the dam, on which the reflective metal RM is disposed, may serve to inhibit the organic encapsulation layer from flowing to the non-active area and serve to inhibit the light introduced into the non-active area from entering the active area. During the process, the outer periphery of the display device may be cured by irradiating the outer side of the touch screen integrated light-emitting display device with high-energy UV rays. In this case, the other elements may be damaged when the high-energy UV rays are introduced into the active area. In the case of the display device according to various embodiments of the present specification, the dams having the structure for blocking the high-energy UV rays, i.e., the reflective metal RM are provided. Therefore, it is possible to inhibit various elements disposed in the active area from being damaged by the high-energy UV rays.

Meanwhile, the touch buffer T-BUF and the touch insulation layer T-ILD may be disposed on the encapsulation part ENCAP and the one or more dams DAM1, DAM2, and DAM3. For example, the touch buffer T-BUF and the touch insulation layer T-ILD may be integrally formed from the upper portion of the encapsulation part ENCAP to the upper portions of the one or more dams DAM1, DAM2, and DAM3. The one or more dams DAM1, DAM2, and DAM3 may be disposed to surround at least three sides of the active area. Therefore, the light-emitting element in the active area is not damaged by high-energy UV rays even though the high-energy UV rays are emitted in three or more directions. However, the present disclosure is not limited thereto.

In the embodiment, the reflective metal RM may be disposed to cover the top surfaces and the side surfaces of the dams DAM1, DAM2, and DAM3 positioned at the outermost periphery among the one or more dams DAM1, DAM2, and DAM3. However, the present disclosure is not limited thereto. The reflective metal RM may be disposed to cover all the top surfaces and the side surfaces of the one or more dams DAM1, DAM2, and DAM3. Alternatively, the reflective metal RM may be disposed to cover the top surfaces and the side surfaces of the one or more dams DAM1, DAM2, and DAM3 and cover at least a part of the active area disposed adjacent to the dams DAM1, DAM2, and DAM3.

Hereinafter, structures of the display device, which are applied to various embodiments of the present specification, will be additionally described. However, various embodiments of the present specification are not limited thereto.

At least one of the primary dam DAM1, the secondary dam DAM2, and the tertiary dam DAM3 may have a structure in which the first inorganic encapsulation layer PAS2 or the second inorganic encapsulation layer PAS3 is stacked on the bank BANK.

The organic encapsulation layer PCL may be positioned only on an inner surface of the primary dam DAM1. However, the present disclosure is not limited thereto. The organic encapsulation layer PCL may be positioned on the upper portion of at least a part of the primary dam DAM1, the secondary dam DAM2, or the tertiary dam DAM3. For example, the organic encapsulation layer PCL may be positioned on the upper portion of the primary dam DAM1.

The second inorganic encapsulation layer PAS3 may be formed on the substrate SUB on which the organic encapsulation layer PCL is formed. The second inorganic encapsulation layer PAS3 may be formed to cover the top surface and the side surface of the organic encapsulation layer PCL and the top surface and the side surface of the first inorganic encapsulation layer PAS2. The second inorganic encapsulation layer PAS3 minimizes or suppresses or reduces the penetration of outside moisture or oxygen into the first inorganic encapsulation layer PAS2 and the organic encapsulation layer PCL. For example, the second inorganic encapsulation layer PAS3 may be made of an inorganic insulating material such as silicon nitride (SiNx), silicon oxide (SiOx), oxidation silicon nitride (SiON), or aluminum oxide ($Al_2O_3$).

The touch buffer T-BUF may be disposed on the encapsulation part ENCAP. The touch buffer T-BUF may be positioned between the second electrode E2 of the light-emitting element ED and the touch sensor metal including the X-touch electrode X-TE, the Y-touch electrode Y-TE, the X-touch electrode connection line X-CL, and the Y-touch electrode connection line Y-CL.

The touch buffer T-BUF may be designed such that a spacing distance between the touch sensor metal and the second electrode E2 of the light-emitting element ED is maintained to be a predetermined or selected minimum or reduced spacing distance (e.g., 1 um). Therefore, it is possible to reduce or suppress or reduce parasitic capacitance formed between the touch sensor metal and the second electrode E2 of the light-emitting element ED. Further, it is possible to reduce the deterioration in touch sensitivity caused by the parasitic capacitance. However, the present specification is not limited to the above-mentioned embodiment. The touch sensor metal including the X-touch electrode X-TE, the Y-touch electrode Y-TE, the X-touch electrode connection line X-CL, and the Y-touch electrode connection line Y-CL may be disposed on the encapsulation part ENCAP without the touch buffer T-BUF.

The touch buffer T-BUF may inhibit outside moisture or a liquid chemical (e.g., a developer or an etching liquid), which is used for a process of manufacturing the touch sensor metal disposed on the touch buffer T-BUF, from penetrating into the light-emitting layer EL including an organic material. Therefore, the touch buffer T-BUF may suppress damage to the light-emitting layer EL vulnerable to the liquid chemical or moisture.

The touch buffer T-BUF may be formed at a low temperature equal to or lower than a predetermined or selected temperature (e.g., 100 degrees) to suppress damage to the light-emitting layer EL including an organic material vulnerable to a high temperature. The touch buffer T-BUF is made of an organic insulating material having low permittivity. For example, the touch buffer T-BUF may be made of an acrylic-based, epoxy-based, or siloxane-based material. The touch buffer T-BUF, which is made of an organic insulating material and has planarization performance, may suppress the damage to the encapsulation layer and the breakage of the touch sensor metal caused when the organic light-emitting display device is bent.

According to the touch sensor structure based on mutual-capacitance, the X-touch electrode line X-TEL and the Y-touch electrode line Y-TEL may be disposed on the touch buffer T-BUF, and the X-touch electrode line X-TEL and the Y-touch electrode line Y-TEL may be disposed to overlap each other.

The Y-touch electrode line Y-TEL may include the plurality of Y-touch electrode connection lines Y-CL that electrically connects the plurality of Y-touch electrodes Y-TE and the plurality of Y-touch electrodes Y-TE. The plurality of Y-touch electrodes Y-TE and the plurality of Y-touch electrode connection lines Y-CL may be positioned on different layers with the touch insulation film interposed therebetween.

The plurality of Y-touch electrodes Y-TE may be spaced apart from one another at predetermined or selected intervals in the y-axis direction. The plurality of Y-touch electrodes Y-TE may each be electrically connected to another Y-touch electrode Y-TE adjacent in the y-axis direction through the Y-touch electrode connection line Y-CL.

The Y-touch electrode connection line Y-CL may be formed on the touch buffer T-BUF film and electrically connected to the two Y-touch electrodes Y-TE adjacent in the y-axis direction while being exposed through a touch contact hole formed through the touch insulation film.

The Y-touch electrode connection line Y-CL may be disposed to overlap the bank BANK. Therefore, it is possible to suppress the deterioration in aperture ratio caused by the Y-touch electrode connection line Y-CL.

The X-touch electrode line X-TEL may include a plurality of X-touch electrode connection lines X-CL that electrically connects the plurality of X-touch electrodes X-TE and the plurality of X-touch electrodes X-TE.

The plurality of X-touch electrodes X-TE may be spaced apart from one another at predetermined or selected intervals in the x-axis direction and disposed on the touch insulation film T-ILD. The plurality of X-touch electrodes X-TE may each be electrically connected to another X-touch electrode X-TE adjacent in the x-axis direction through the X-touch electrode connection line X-CL.

The X-touch electrode connection line X-CL may be disposed on the same plane as the X-touch electrode X-TE and electrically connected to the two X-touch electrodes X-TE adjacent in the x-axis direction without a separate contact hole. The X-touch electrode connection line X-CL may be integrated with the two X-touch electrodes X-TE adjacent in the x-axis direction.

The X-touch electrode connection line X-CL may be disposed to overlap the bank BANK. Therefore, it is possible to suppress the deterioration in aperture ratio caused by the X-touch electrode connection line X-CL.

Meanwhile, the Y-touch electrode line Y-TEL may be electrically connected to the touch drive circuit TDC through the Y-touch routing line Y-TL and the Y-touch pad Y-TP. Likewise, the X-touch electrode line X-TEL may be electrically connected to the touch drive circuit TDC through the X-touch routing line X-TL and the X-touch pad X-TP.

A pad cover electrode configured to cover the X-touch pad X-TP and the Y-touch pad Y-TP may be further disposed.

The X-touch pad X-TP may be formed independently of the X-touch routing line X-TL or formed by extending the X-touch routing line X-TL. The Y-touch pad Y-TP may be formed independently of the Y-touch routing line Y-TL or formed by extending the Y-touch routing line Y-TL.

The X-touch pad X-TP, the X-touch routing line X-TL, the Y-touch pad Y-TP, and the Y-touch routing line Y-TL may be made of the same first conductive material in case that the X-touch pad X-TP is formed by extending the X-touch routing line X-TL and the Y-touch pad Y-TP is formed by extending the Y-touch routing line Y-TL. In this case, the first conductive material may be configured as a single-layer or multilayer structure made of metal such as Al, Ti, Cu, or Mo, for example, that has high corrosion resistance and acid resistance and excellent conductivity.

For example, the X-touch pad X-TP, the X-touch routing line X-TL, the Y-touch pad Y-TP, and the Y-touch routing line Y-TL, which are made of the first conductive material, may each have a three-layer structure in which Ti, Al, and Ti are stacked or Mo, Al, and Mo are stacked.

The pad cover electrode, which may cover the X-touch pad X-TP and the Y-touch pad Y-TP, may be made of a second conductive material identical to the material of the first touch electrode and the Y-touch electrode Y-TE. In this case, the second conductive material may be a transparent conductive material such as ITO or IZO that has high corrosion resistance and acid resistance. The pad cover electrode is formed to be exposed by the touch buffer film T-BUF, such that the pad cover electrode may be bonded to the touch drive circuit TDC or bonded to a circuit film on which the touch drive circuit TDC is mounted.

In this case, a cover organic layer PAC may be formed to cover the touch sensor metal, thereby inhibiting the touch sensor metal from being corroded by outside moisture or the like. For example, the cover organic layer PAC may be made of an organic insulating material or provided in the form of a circular polarizing plate or a film made of epoxy or an acrylic material. The cover organic layer PAC may not be present on the encapsulation part ENCAP. That is, the cover organic layer PAC is not an essential component.

The Y-touch routing line Y-TL may be electrically connected to the Y-touch electrode Y-TE through a touch routing line contact hole or integrated with the Y-touch electrode Y-TE.

The Y-touch routing line Y-TL may be extended to the non-active area NA, pass over the upper portion and the side surface of the encapsulation part ENCAP and the upper portions and the side surfaces of the dams DAM1, DAM2, and DAM3, and be electrically connected to the Y-touch pad Y-TP. Therefore, the Y-touch routing line Y-TL may be electrically connected to the touch drive circuit TDC through the Y-touch pad Y-TP.

The Y-touch routing line Y-TL may transmit the touch sensing signal from the Y-touch electrode Y-TE to the touch drive circuit TDC. Alternatively, the Y-touch routing line Y-TL may receive the touch driving signal from the touch drive circuit TDC and transmit the touch driving signal to the Y-touch electrode Y-TE.

The X-touch routing line X-TL may be electrically connected to the X-touch electrode X-TE through the touch routing line contact hole or integrated with the X-touch electrode X-TE.

The X-touch routing line X-TL may be extended to the non-active area NA, pass over the upper portion and the side surface of the encapsulation part ENCAP and the upper portions and the side surfaces of the dams DAM1, DAM2, and DAM3, and be electrically connected to the X-touch pad Y-TP. Therefore, the X-touch routing line X-TL may be electrically connected to the touch drive circuit TDC through the X-touch pad X-TP.

The X-touch routing line X-TL may receive the touch driving signal from the touch drive circuit TDC and transmit the touch driving signal to the X-touch electrode X-TE. The X-touch routing line X-TL may transmit the touch sensing signal from the X-touch electrode X-TE to the touch drive circuit TDC.

The arrangement of the X-touch routing line X-TL and the Y-touch routing line Y-TL may be variously changed in accordance with the panel design.

The touch protective film PAC may be disposed on the X-touch electrode X-TE and the Y-touch electrode Y-TE. The touch protective film PAC may be expanded to a location before or after the dams DAM1, DAM2, and DAM3, such that the touch protective film PAC may also be disposed on the X-touch routing line X-TL and the Y-touch routing line Y-TL.

Meanwhile, a cross-sectional view in FIG. 9 illustrates a conceptually structure. Each of the patterns (various types of layers or various types of electrodes) may change in position, thickness, or width depending on the visual direction or position. The connection structures between various types of patterns may also be changed. Several additional layers may be further present in addition to the illustrated layers. Some of the illustrated layers may be excluded or integrated. For example, a width of the bank BANK may be smaller than a width illustrated in the drawings, and a height of each of the dams DAM1, DAM2, and DAM3 may be smaller or larger than a height illustrated in the drawings.

In addition, the cross-sectional view in FIG. 9 illustrates a structure in which the touch electrodes X-TE and Y-Te, the touch routing lines X-TL and Y-TL, and the like are entirely disposed on the subpixel SP in order to show an example of a structure in which the touch electrodes X-TE and Y-Te, the touch routing lines X-TL and Y-TL, and the like are connected to the touch pads X-TP and Y-TP along the touch routing lines X-TL and Y-TL and the inclined surface of the encapsulation part ENCAP. However, in case that the touch electrodes X-TE and Y-TE are each a mesh type, the holes of the touch electrodes X-TE and Y-TE may be positioned in the light-emitting area of the subpixel SP. Further, a color filter (not illustrated) may be further disposed on the encapsulation part ENCAP. The color filter (not illustrated) may be positioned on the touch electrodes X-TE and Y-TE or positioned between the encapsulation part ENCAP and the touch electrodes X-TE and Y-TE.

Hereinafter, various examples in which reflective metals applied to various embodiments of the present specification are disposed will be described with reference to FIGS. 10 to 12. The remaining constituent elements, excluding the reflective metal, are identical to those described with reference to FIG. 9, and a repeated description thereof will be omitted for convenience.

Figure 10:
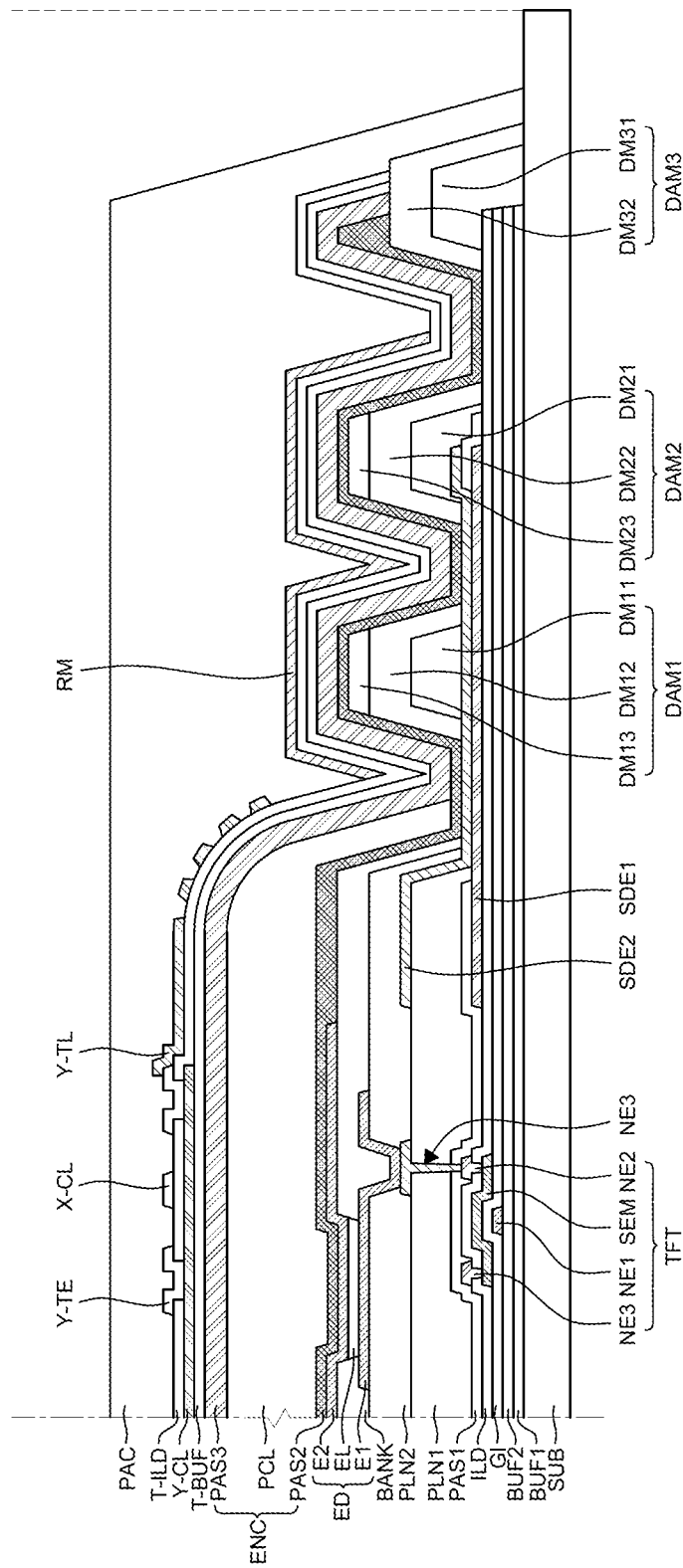
FIGS. 10 to 12 are exemplary cross-sectional views taken along line X-X' illustrating display panels according to various embodiments.
Figure 11:
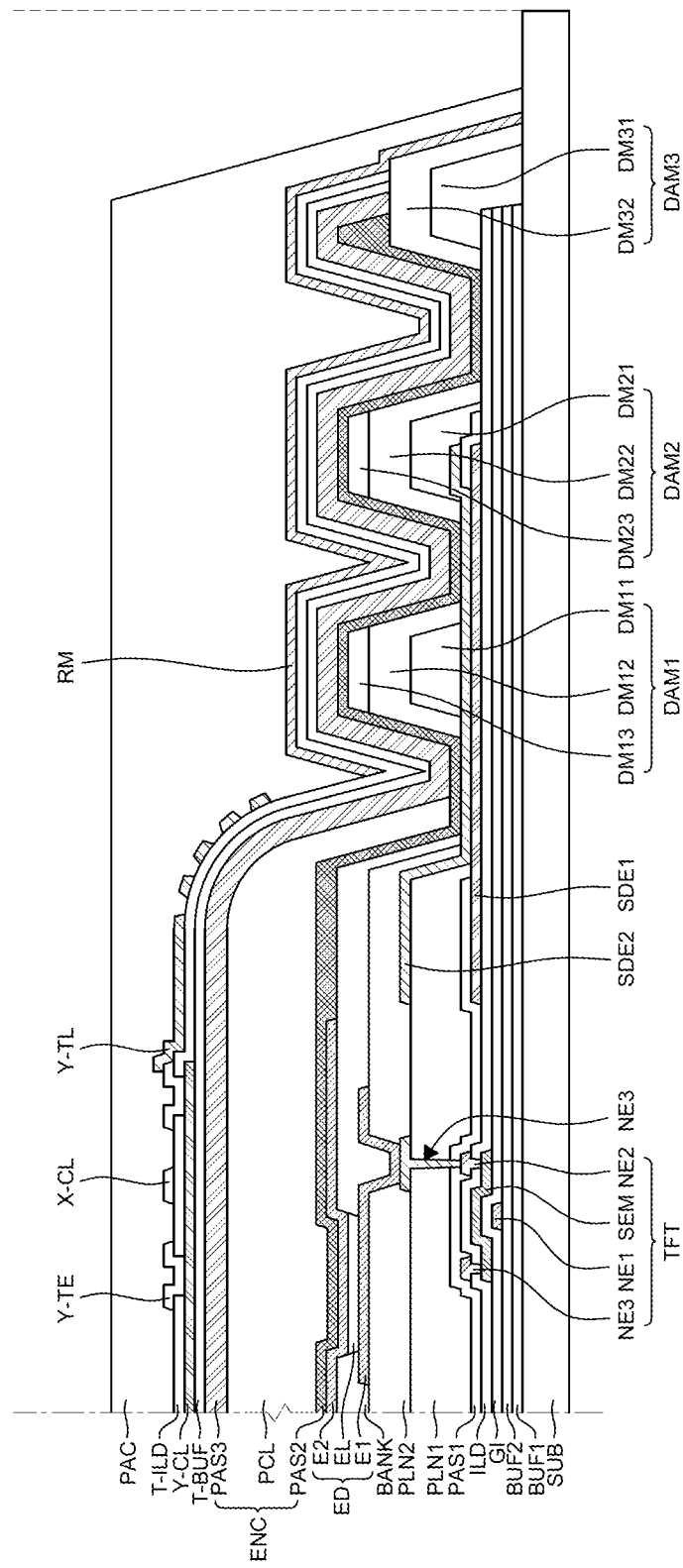
Figure 12:
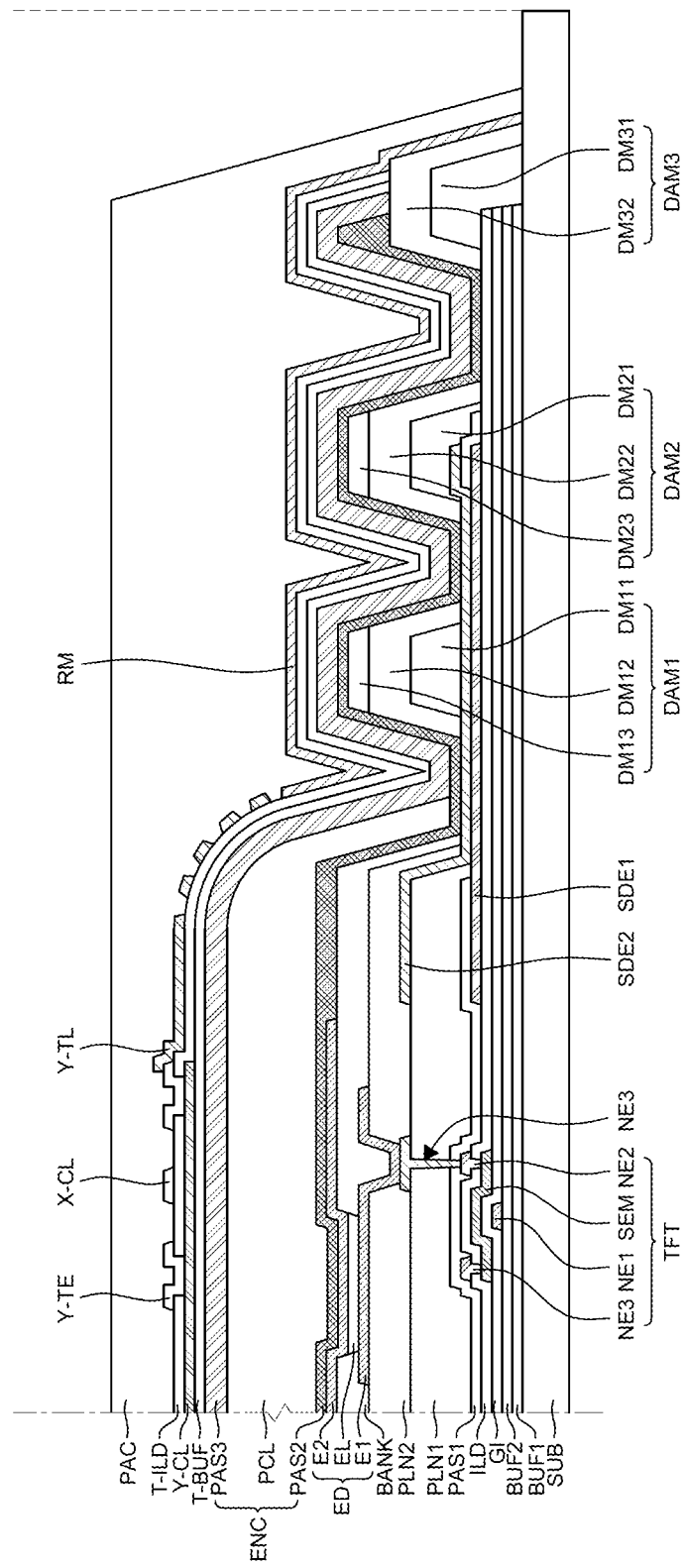

FIGS. 10 to 12 are exemplary cross-sectional views taken along line X-X' illustrating display panels according to various embodiments.

With reference to FIG. 10, the reflective metal RM may be disposed to be integrated with the upper portion of the primary dam DAM1 and the upper portion of the secondary dam DAM2. In detail, the reflective metal RM may be disposed only on the upper portion of the primary dam DAM1 and the upper portion of the secondary dam DAM2. The reflective metal RM may be eliminated from or not present on the upper portion of the tertiary dam DAM3. The reflective metal RM may be made of substantially the same material as the touch sensor metal. In addition, the reflective metal RM may be simultaneously formed by substantially the same process as the touch sensor metal. A range beneficial for the process may be decreased as the reflective metal RM and the touch sensor metal become closer to each other. Therefore, the process costs of the light-emitting display device may be reduced.

With reference to FIG. 11, the reflective metal RM may be disposed to be integrated with the upper portion of the primary dam DAM1, the upper portion of the secondary dam DAM2, and the upper portion of the tertiary dam DAM3. In detail, the reflective metal RM may be disposed to cover the top surfaces and the side surfaces of all the primary dam DAM1, the secondary dam DAM2, and the tertiary dam DAM3. The reflective metal RM may more easily reflect high-energy UV rays, which are introduced from the outside, as the area in which the reflective metal RM is disposed increases.

With reference to FIG. 12, the reflective metal RM may be disposed to be integrated with not only the inclined surface positioned on the boundary between the dam area and the active area but also the upper portions of the primary dam DAM1, the secondary dam DAM2, and the tertiary dam DAM3. In other words, the reflective metal RM may extend to not only the dam area but also at least a part of the active area. A U-shaped bent portion or a V-shaped bent portion may be formed between the dam area and the active area, and the reflective metal RM may extend to an inclined surface of the bent portion. Because the reflective metal RM extends to the inclined surface of the bent portion, the light directed toward the active area is more hardly introduced into the active area, such that the light may be reflected to the outside by the reflective metal RM. Meanwhile, because the bent portion is formed between the active area and the dam area, the encapsulation part, which is disposed on the light-emitting element, may not be disposed on one or more dams.

The exemplary embodiments of the present disclosure can also be described as follows:

According to an aspect of the present disclosure, a light-emitting display device comprise a substrate comprising a display area and a non-display area, one or more dams disposed in the non-display area and configured to surround the display area, and a reflective metal disposed on at least one of the one or more dams.

The reflective metal may be integrated and disposed in the non-display area.

The reflective metal may be integrated and configured to cover the one or more dams.

The light-emitting display device may further comprise an encapsulation part configured to cover the display area, and a plurality of touch sensor metals disposed on the encapsulation part in the display area.

The touch sensor metal may be made of the same material as the reflective metal.

The light-emitting display device may further comprise a touch insulation layer disposed between the encapsulation part and the touch sensor metal.

The touch insulation layer may be disposed on the encapsulation part and the one or more dams.

The touch insulation layer may be integrated from an upper side of the encapsulation part to upper sides of the one or more dams.

The one or more dams may surround at least three sides of the display area.

The reflective metal may be disposed to cover a top surface and a side surface of the dam positioned at an outermost periphery among the one or more dams.

The reflective metal may be disposed to cover top surfaces and side surfaces of all the one or more dams.

The reflective metal may be disposed to cover top surfaces and side surfaces of the one or more dams and cover at least a part of the display area disposed adjacent to the dam.

According to another aspect of the present disclosure, A light-emitting display device comprise a substrate including a display area and a dam area configured to surround the display area, one or more light-emitting elements disposed in the display area, and an encapsulation part disposed on the light-emitting element, a touch insulation layer and a touch sensor metal disposed on the encapsulation part and one or more dams, and the one or more dams disposed in the dam area, and a reflective metal configured to cover top surfaces and side surfaces of the one or more dams.

The touch insulation layer may be disposed over the display area and the non-display area.

The touch insulation layer may be disposed on the encapsulation part in the display area and disposed on the one or more dams in the dam area.

The reflective metal and the touch sensor metal may be made of the same material.

The reflective metal may be integrated and disposed to cover the top surface and the side surface of the dam positioned at an outermost periphery among the one or more dams.

The reflective metal may be integrated and disposed to cover the top surfaces and the side surfaces of all the one or more dams.

The reflective metal may be integrated and disposed to cover the top surfaces and the side surfaces of the one or more dams and cover at least a part of the display area disposed adjacent to the dam.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light-emitting display device comprising:
    a substrate including a display area and a non-display area;
    one or more buffer layers, a gate insulation film and an insulation layer disposed on the substrate;
    one or more dams disposed in the non-display area and configured to surround the display area;
    an encapsulation part covering the display area;
    a plurality of touch sensor metals disposed on the encapsulation part in the display area;
    a touch buffer disposed on one or more dams;
    a touch insulation layer disposed between the encapsulation part, the plurality of touch sensor metals and one or more dams and disposed on the touch buffer; and
    a reflective metal disposed on at least one of the one or more dams,
    wherein the outermost dam among one or more dams covers part of the upper surface and part of the side surface of the one or more buffer layers, the gate insulation film and the insulation layer,
    wherein the reflective metal is disposed on the same layer as the touch sensor metal, and
    wherein the reflective metal is in contact with a portion of the upper surface of the touch insulation layer and covers a portion of the side surface of the touch insulation layer.

2. The light-emitting display device of claim 1, wherein the reflective metal is integrated and disposed in the non-display area.

3. The light-emitting display device of claim 1, wherein the reflective metal is integrated and configured to cover the one or more dams.

4. The light-emitting display device of claim 1, wherein the plurality of touch sensor metals is made of the same material as the reflective metal.

5. The light-emitting display device of claim 1, wherein the touch insulation layer is disposed on the encapsulation part and the one or more dams.

6. The light-emitting display device of claim 5, wherein the touch insulation layer is integrated from an upper side of the encapsulation part to upper sides of the one or more dams.

7. The light-emitting display device of claim 1, wherein the one or more dams surround at least three sides of the display area.

8. The light-emitting display device of claim 1, wherein the reflective metal is disposed to cover a top surface and a side surface of a dam positioned at an outermost periphery among the one or more dams.

9. The light-emitting display device of claim 1, wherein the reflective metal is disposed to cover top surfaces and side surfaces of all of the one or more dams.

10. The light-emitting display device of claim 1, wherein the reflective metal is disposed to cover top surfaces and side surfaces of the one or more dams and cover at least a part of the display area disposed adjacent to the dam.

11. A light-emitting display device comprising:
    a substrate including a display area and a dam area configured to surround the display area;
    one or more buffer layers, a gate insulation film and an insulation layer disposed on the substrate;
    one or more light-emitting elements disposed in the display area, and an encapsulation part disposed on the one or more light-emitting elements;
    a touch insulation layer and a touch sensor metal disposed on the encapsulation part one or more dams, and a touch buffer;
    the one or more dams disposed in the dam area;
    a touch buffer disposed on one or more dams; and
    a reflective metal configured to cover top surfaces and side surfaces of the one or more dams,
    wherein the outermost dam among one or more dams covers part of the upper surface and part of the side surface of the one or more buffer layers, the gate insulation film and the insulation layer,
    wherein the reflective metal is disposed on the same layer as the touch sensor metal, and
    wherein the reflective metal is in contact with a portion of the upper surface of the touch insulation layer and covers a portion of the side surface of the touch insulation layer.

12. The light-emitting display device of claim 11, wherein the touch insulation layer is disposed over the display area and the dam area.

13. The light-emitting display device of claim 11, wherein the touch insulation layer is disposed on the encapsulation part in the display area and disposed on the one or more dams in the dam area.

14. The light-emitting display device of claim 11, wherein the reflective metal and the touch sensor metal are made of the same material.

15. The light-emitting display device of claim 11, wherein the reflective metal is integrated and disposed to cover the top surface and the side surface of a dam positioned at an outermost periphery among the one or more dams.

16. The light-emitting display device of claim 11, wherein the reflective metal is integrated and disposed to cover the top surfaces and the side surfaces of all of the one or more dams.

17. The light-emitting display device of claim 11, wherein the reflective metal is integrated and disposed to cover the top surfaces and the side surfaces of the one or more dams and cover at least a part of the display area disposed adjacent to the dam.

* * * * *